United States Patent
Lee et al.

(10) Patent No.: US 12,225,702 B2
(45) Date of Patent: Feb. 11, 2025

(54) DUAL PORT SRAM CELL AND METHOD OF DESIGNING THE SAME

(71) Applicant: SAMSUNG ELECTRONICS CO., LTD., Suwon-si (KR)

(72) Inventors: Eojin Lee, Suwon-si (KR); Daeyoung Moon, Yongin-si (KR); Hoyoung Tang, Seoul (KR); Taehyung Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 175 days.

(21) Appl. No.: 17/957,826

(22) Filed: Sep. 30, 2022

(65) Prior Publication Data

US 2023/0113482 A1   Apr. 13, 2023

(30) Foreign Application Priority Data

Oct. 12, 2021   (KR) .................. 10-2021-0135305

(51) Int. Cl.
| | |
|---|---|
| G11C 11/412 | (2006.01) |
| G11C 8/16 | (2006.01) |
| G11C 11/419 | (2006.01) |
| H10B 10/00 | (2023.01) |

(52) U.S. Cl.
CPC .............. H10B 10/12 (2023.02); G11C 8/16 (2013.01); G11C 11/412 (2013.01); G11C 11/419 (2013.01)

(58) Field of Classification Search
CPC ......... H10B 10/12; G11C 8/16; G11C 11/412; G11C 11/419
See application file for complete search history.

(56) References Cited

U.S. PATENT DOCUMENTS

| | | | |
|---|---|---|---|
| 8,059,452 B2 | 11/2011 | Liaw | |
| 8,183,639 B2 | 5/2012 | Malinge et al. | |
| 8,315,084 B2 | 11/2012 | Liaw et al. | |
| 8,675,397 B2 | 3/2014 | Liaw | |
| 9,646,974 B1* | 5/2017 | Liaw | .................. G11C 11/412 |
| 9,780,097 B2 | 10/2017 | Lee et al. | |
| 10,381,056 B2 | 8/2019 | Lu et al. | |
| 10,916,296 B2 | 2/2021 | Zhou | |
| 2011/0222332 A1* | 9/2011 | Liaw | .................. G11C 11/413 |
| | | | 365/156 |
| 2011/0317477 A1* | 12/2011 | Liaw | ................ H01L 27/0207 |
| | | | 365/156 |
| 2013/0026580 A1* | 1/2013 | Morimoto | ............. G06F 30/392 |
| | | | 257/E27.099 |
| 2019/0147928 A1 | 5/2019 | Liaw | |

* cited by examiner

*Primary Examiner* — Min Huang
(74) *Attorney, Agent, or Firm* — Sughrue Mion, PLLC

(57) ABSTRACT

A dual-port static random access memory (SRAM) cell is provided. The dual-port SRAM cell includes: P-type active patterns that are spaced apart from one another along a first direction, each of the P-type active patterns extending in a second direction perpendicular to the first direction and including at least one transistor. The P-type active patterns include first through sixth P-type active patterns which are sequentially arranged along the first direction. A first cutting area is provided between the second P-type active pattern and a first boundary of the dual-port SRAM cell that extends along the first direction, and a second cutting area is provided between the fifth P-type active pattern and a second boundary that is opposite to the first boundary and extends along the first direction.

19 Claims, 15 Drawing Sheets

DUAL PORT SRAM CELL AND METHOD OF DESIGNING THE SAME

CROSS-REFERENCE TO RELATED APPLICATION

This application is based on and claims priority under 35 U.S.C. § 119 to Korean Patent Application No. 10-2021-0135305, filed on Oct. 12, 2021, in the Korean Intellectual Property Office, the disclosure of which is incorporated by reference herein in its entirety.

BACKGROUND

The present disclosure relates to a dual-port static random-access memory (SRAM) cell and a method of designing the same, and more particularly, to a layout of a dual-port SRAM cell including an active pattern cut by a cutting unit.

Semiconductor technology is continuously being developed to reduce size, increase integration, increase capacity, increase speed, and provide stable operation. Efforts of semiconductor producers have brought advances in microprocessing technology, micro-device technology, and circuit design technology, and remarkable achievements are being made in the technology of semiconductor memory cells.

A dual-port SRAM capable of performing high-speed read and write operations as compared to single-port SRAMs has been developed. In a single-port SRAM, one unit memory cell includes six transistors (i.e., two load transistors, two driving transistors, and two active transistors) and may sequentially perform read and write operations. A dual-port SRAM is configured to concurrently perform more than one read and write operation in a dual mode

SUMMARY

One or more example embodiments provide an integrated circuit for implementing a pull-down transistor by using an active pattern cut by a cutting unit.

One or more example embodiments also provide an integrated circuit with improved performance of a bit cell by implementing a pull-down transistor by using a plurality of active patterns having different widths in a first direction.

The technical goals of the present disclosure are not limited to those mentioned above, and other technical goals not mentioned will be clearly understood by one or ordinary skill in the art from descriptions below.

According to an aspect of an example embodiment, A dual-port SRAM cell includes: a plurality of P-type active patterns that are spaced apart from one another along a first direction, each of the plurality of P-type active patterns extending in a second direction perpendicular to the first direction and including at least one transistor, wherein the plurality of P-type active patterns includes a first P-type active pattern, a second P-type active pattern, a third P-type active pattern, a fourth P-type active pattern, a fifth P-type active pattern and a sixth P-type active pattern which are sequentially arranged along the first direction. A first cutting area is provided between the second P-type active pattern and a first boundary of the dual-port SRAM cell that extends along the first direction, and a second cutting area is provided between the fifth P-type active pattern and a second boundary that is opposite to the first boundary and extends along the first direction.

According to an aspect of an example embodiment, a bit cell includes: a plurality of active patterns spaced apart from one another along a first direction, each of the plurality of active patterns extending in a second direction perpendicular to the first direction and having a constant width in the first direction between a first boundary of the bit cell and a second boundary of the bit cell opposite to the first boundary, wherein the first boundary and the second boundary extend in the first direction, and the plurality of active patterns includes a first active pattern, a second active pattern, a third active pattern, a fourth active pattern, a fifth active pattern, a sixth active pattern, a seventh active pattern and an eighth active pattern that are sequentially arranged along the first direction; a first gate electrode provided on the second active pattern, the third active pattern and the fourth active pattern, and extending in the first direction; and a second gate electrode provided on the fifth active pattern, the sixth active pattern and the seventh active pattern, extending in the first direction, and spaced apart from the first gate electrode along the second direction. A first cutting area is provided between the second active pattern and the first boundary, a second cutting area is provided between the seventh active pattern and the second boundary, and the third active pattern and the sixth active pattern extend from the first boundary to the second boundary.

According to an aspect of an example embodiment, a dual-port SRAM cell includes: a plurality of active patterns spaced apart from one another along a first direction, each of the plurality of active patterns extending in a second direction perpendicular to the first direction and having a constant width in the first direction between a first boundary of the dual-port SRAM cell and a second boundary of the dual-port SRAM cell opposite to the first boundary, wherein the first boundary and the second boundary extend in the first direction, and the plurality of active patterns includes a first active pattern, a second active pattern, a third active pattern and a fourth active pattern that are sequentially arranged along the first direction; a first gate electrode provided on the second active pattern, the third active pattern and the fourth active pattern, extending in the first direction, and spaced apart from the first active pattern along the second direction; and a second gate electrode provided on the third active pattern, extending in the first direction, and spaced apart from the first gate electrode along the second direction. A cutting area is provided between the second active pattern and the first boundary, and the second active pattern and the third active pattern have different widths along the first direction.

BRIEF DESCRIPTION OF THE DRAWINGS

The above and other aspects will be more clearly understood from the following description of example embodiments taken in conjunction with the accompanying drawings, in which.

DETAILED DESCRIPTION

Hereinafter, in a layout diagram, the horizontal direction when viewed from above may be referred to as a first direction X, the vertical direction when viewed from above may be referred to as a second direction Y, and a direction substantially perpendicular to the layout diagram may be referred to as a third direction Z. The first direction X may be perpendicular to the second direction Y. A direction indicated by an arrow in a drawing and a direction opposite thereto may be described as the same direction.

Figure 1:
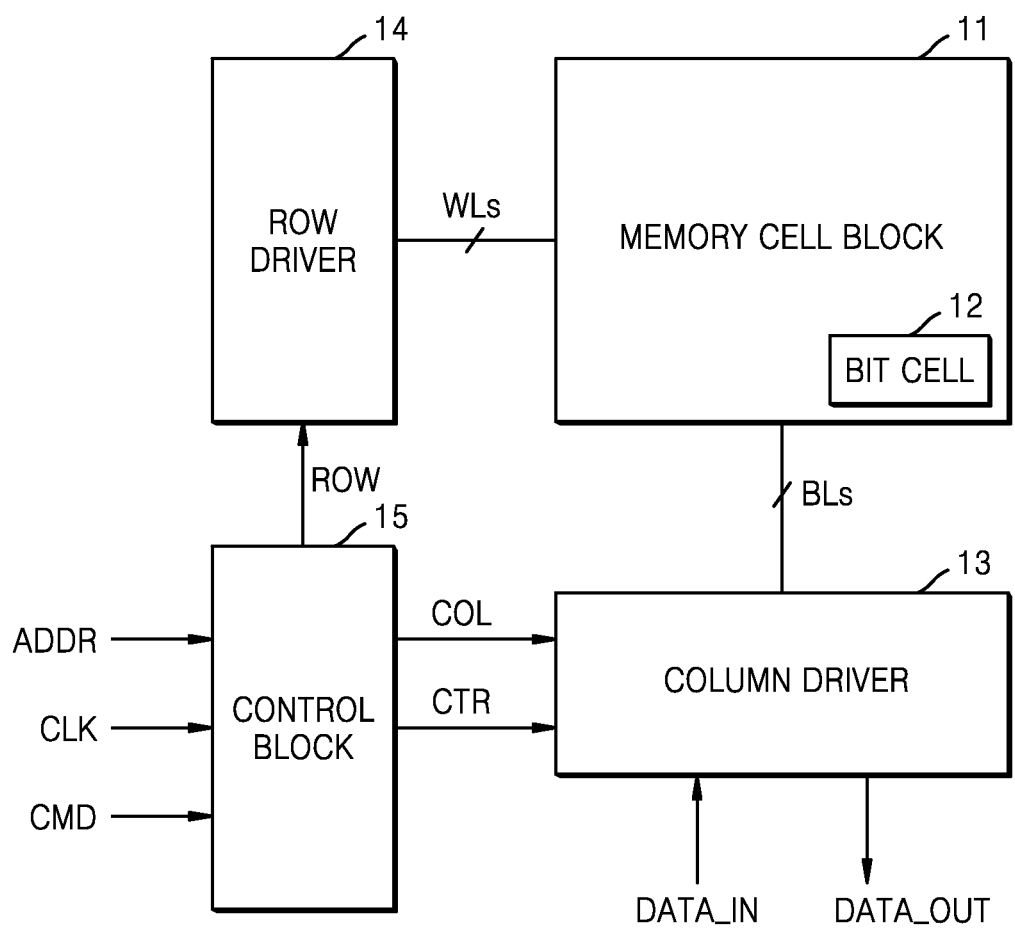
FIG. 1 is a block diagram of an integrated circuit (IC) according to example embodiments.

FIG. 1 is a block diagram of an integrated circuit according to an example embodiment.

Referring to FIG. 1, an integrated circuit 10 may receive a command CMD, an address ADDR, a clock CLK, write data DATA_IN, and read data DATA_OUT. For example, the integrated circuit 10 may receive a command CMD (which may be referred to as a write command) instructing to write, an address ADDR (which may be referred to as a write address), and write data DATA_IN, and may store the write data DATA_IN in a region of a memory cell block 11 corresponding to the address ADDR. Also, the integrated circuit 10 may receive a command CMD (which may be referred to as a read command) and an address ADDR (which may be referred to as a read address) instructing to read, and may output the read data DATA_OUT stored in a region of the memory cell block 11 corresponding to the address ADDR to the outside.

The memory cell block 11 may include a plurality of bit cells 12. The bit cells 12 may be arranged at regular intervals. The bit cells 12 may be arranged at intersections of word lines WLs and bit lines BLs. Each of the bit cells 12 may be connected to at least one of the word lines WLs and may be connected to at least one of the bit lines BLs.

Each of the bit cells 12 may be a memory cell. For example, each of the bit cells 12 may be a static random access memory (SRAM) or other volatile memory cell such as, for example, a dynamic random access memory (DRAM). In particular, each of the bit cells 12 may be a dual-port SRAM (hereinafter referred to as 'DPSRAM') cell capable of simultaneously performing a write operation and a read operation. In some example embodiments, a bit cell 12 may be a non-volatile memory cell such as a flash memory and a resistive random access memory (RRAM). Example embodiments will be mainly described with reference to a DPSRAM cell, but example embodiments are not limited thereto.

A column driver 13 may be connected to the memory cell block 11 through a plurality of bit lines BLs. The column driver 13 may select at least one bit line from among the bit lines BLs based on a column address COL. For example, the column driver 13 may select a first bit line (BLA of FIG. 2) and a first bit line bar (BLAb of FIG. 2) complementary to the first bit line (BLA of FIG. 2). The first bit line BLA and the first bit line bar BLAb may be connected to any one of the bit cells 12. As the column driver 13 selects the first bit line BLA and the first bit line bar BLAb, the bit cells 12 connected to the first bit line BLA and the first bit line bar BLAb may be selected.

The column driver 13 may perform a read operation or a write operation based on a control signal CTR. The column driver 13 may detect a current and/or a voltage received through the bit lines BLs, identify values stored in a bit cell connected to an activated word line from among the bit cells 12, and output the read data DATA_OUT based on identified values. The column driver 13 may apply a current and/or a voltage to the bit lines BLs based on the write data DATA_IN and write values to the bit cells connected to the activated word line from among the bit cells 12. According to example embodiments, the column driver 13 may include a read circuit that performs a read operation and a write circuit that performs a write operation. Also, the column driver 13 may include a bit line pre-charge circuit for pre-charging the bit lines BLs.

The row driver 14 may be connected to the memory cell block 11 through a plurality of word lines WLs. The row driver 14 may activate at least one word line from among the word lines WLs based on a row address ROW. For example, the row driver 14 may select at least any one of the word lines WLs based on the row address ROW. Therefore, bit cells connected to an activated word line may be selected from among the bit cells 12.

A control block 15 may receive a command CMD, an address ADDR, and a clock CLK and may generate a row address ROW, a column address COL, and a control signal CTR. For example, the control block 15 may identify a read command by decoding the command CMD, and, to read the read data DATA_OUT from the memory cell block 11, may generate a row address ROW, a column address COL, and a control signal CTR. Also, the control block 15 may identify a write command by decoding the command CMD, and, to write the write data DATA_IN to the memory cell block 11, may generate a row address ROW, a column address COL, and a control signal CTR.

Because descriptions of example embodiments mainly focus on a DPSRAM cell, the bit cells 12 may each be connected to two word lines, two bit lines, and two complementary bit lines. Hereinafter, the layout of each of the bit cells 12 will be described in detail.

Figure 2:
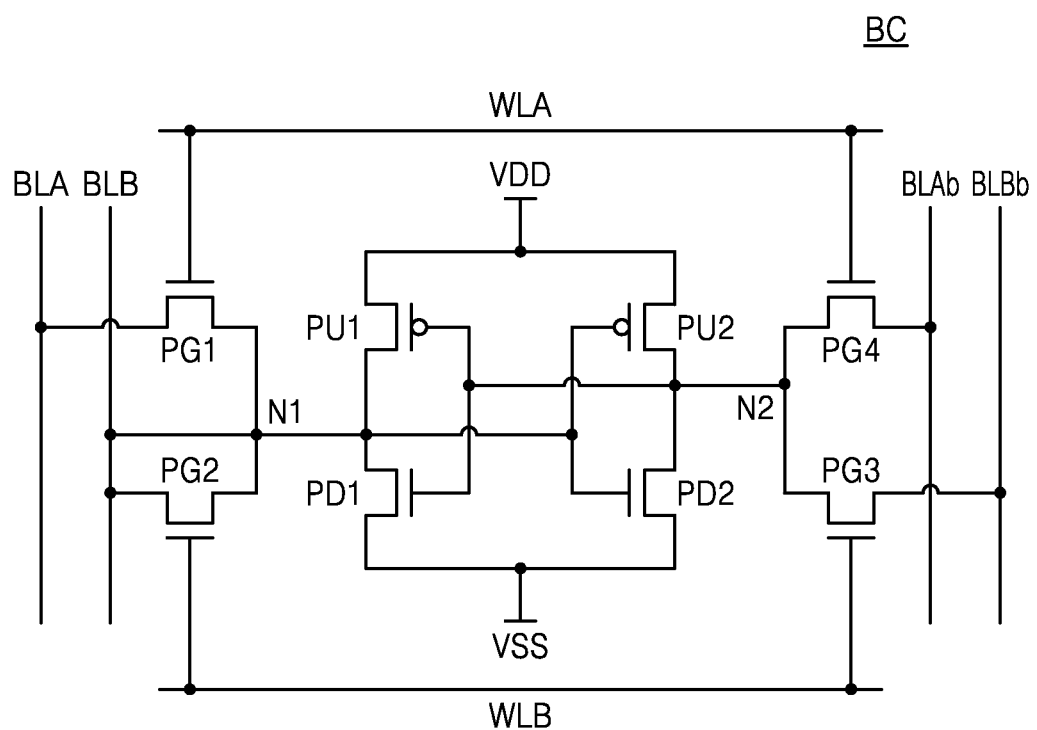
FIG. 2 is a circuit diagram of a bit cell according to example embodiments.

FIG. 2 is a circuit diagram of a bit cell according to an example embodiment. In detail, FIG. 2 is an equivalent circuit diagram of the bit cell 12 of FIG. 1.

Referring to FIG. 2, a bit cell BC may be a DPSRAM cell. The bit cell BC may include a first pass transistor PG1, a second pass transistor PG2, a third pass transistor PG3, a fourth pass transistor PG4, a first pull-up transistor PU1, a second pull-up transistor PU2, a first pull-down transistor PD1, and a second pull-down transistor PD2.

First to fourth pass transistors PG1, PG2, PG3, and PG4 and first and second pull-down transistors PD1 and PD2 may be N-type transistors, and first and second pull-up transistors PU1 and PU2 may be P-type transistors. First to fourth pass transistors PG1, PG2, PG3, and PG4 and first and second pull-down transistors PD1 and PD2 may be N-channel MOSFETs (NFETs), and first and second pull-up transistors PU1 and PU2 may be P-channel MOSFETs (PFETs).

The first pull-up transistor PU1 and the first pull-down transistor PD1 may constitute a first inverter, and the second pull-up transistor PU2 and the second pull-down transistor PD2 may constitute a second inverter.

In detail, a drain terminal of the first pull-up transistor PU1 may be connected to a drain terminal of the first pull-down transistor PD1, and a gate of the first pull-up transistor PU1 may be electrically connected to a gate of the first pull-down transistor PD1. A power voltage VDD may be applied to a source terminal of the first pull-up transistor PU1, and a ground voltage VSS may be applied to a source terminal of the first pull-down transistor PD1. Therefore, the first pull-up transistor PU1 and the first pull-down transistor PD1 may constitute the first inverter.

In the same regard, a drain terminal of the second pull-up transistor PU2 may be connected to a drain terminal of the second pull-down transistor PD2, and a gate of the second pull-up transistor PU2 may be electrically connected to a gate of the second pull-down transistor PD2. The power voltage VDD may be applied to a source terminal of the second pull-up transistor PU2, and the ground voltage VSS may be applied to a source terminal of the second pull-down transistor PD2. Therefore, the second pull-up transistor PU2 and the second pull-down transistor PD2 may constitute the second inverter.

The gate of the first pull-up transistor PU1 and the gate of the first pull-down transistor PD1 connected to each other may correspond to an input terminal of the first inverter, and a first node N1 connected to the drain terminal of the first pull-up transistor PU1 and the drain terminal of the first pull-down transistor PD1 may correspond to an output terminal of the first inverter.

The gate of the second pull-up transistor PU2 and the gate of the second pull-down transistor PD2 connected to each other may correspond to an input terminal of the second inverter, and a second node N2 connected to the drain terminal of the second pull-up transistor PU2 and the drain terminal of the second pull-down transistor PD2 may correspond to an output terminal of the second inverter.

The first inverter and the second inverter may be coupled to each other in a latch structure. For example, the gate of the first pull-up transistor PU1 and the gate of the first pull-down transistor PD1 may be connected to the second node N2, and the gate of the second pull-up transistor PU2 and the gate of the second pull-down transistor PD2 may be connected to the first node N1.

A drain terminal of the first pass transistor PGT and a source terminal of the second pass transistor PG2 may be connected to the first node N1. A source terminal of the first pass transistor PG1 may be connected to a first bit line BLA, and a drain terminal of the second pass transistor PG2 may be connected to a second bit line BLB. The first pass transistor PG1 and the second pass transistor PG2 may be connected to the first node N1.

Similarly, the third pass transistor PG3 and the fourth pass transistor PG4 may be connected to the second node N2. A source terminal of the third pass transistor PG3 and a drain terminal of the fourth pass transistor PG4 may be connected to the second node N2. A drain terminal of the third pass transistor PG3 may be connected to a second bit line bar BLBb, and a source terminal of the fourth pass transistor PG4 may be connected to a first bit line bar BLAb.

A gate of the first pass transistor PG1 and a gate of the fourth pass transistor PG4 may be connected to a first word line WLA, and a gate of the second pass transistor PG2 and a gate of the third pass transistor PG3 may be connected to a second word line WLB.

The bit cell BC may include the first pass transistor PG1 and the second pass transistor PG2 connected to the first node N1 and the third pass transistor PG3 and the fourth pass transistor PG4 connected to the second node N2, thereby implementing a dual port. In detail, by using the first word line WLA, the first bit line BLA, and a first complementary bit line BLAb, logic data may be written or read out through the first node N1 and the second node N2. Similarly, by using the second word line WLB, the second bit line BLB, and a second complementary bit line BLBb, logic data may be written or read out through the first node N1 and the second node N2. The bit cell BC may simultaneously perform a write operation and a read operation through a dual port.

According to an example embodiment, the first pull-down transistor PD1 and the second pull-down transistor PD2 may each include a plurality of transistors connected in parallel. Hereinafter, the first pull-down transistor PD1 and the second pull-down transistor PD2 will be described in detail with reference to FIG. 3.

Figure 3:
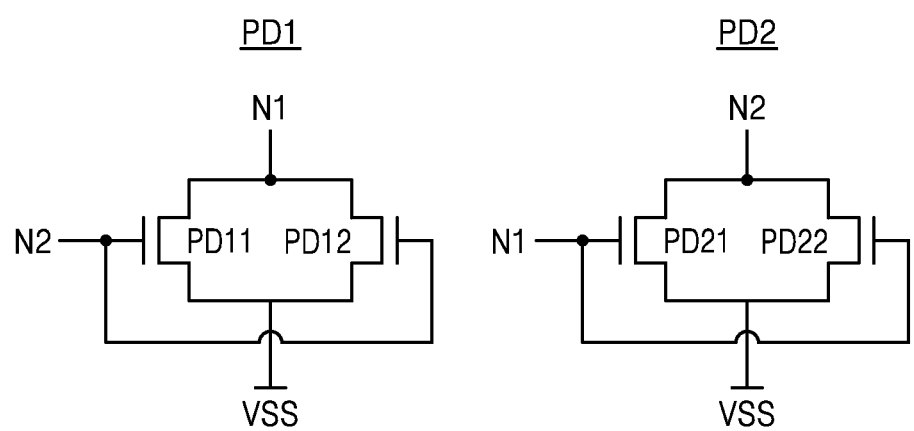
FIG. 3 illustrates circuit diagrams of pull-down transistors according to example embodiments.

FIG. 3 illustrates circuit diagrams of pull-down transistors according to example embodiments. In detail, FIG. 3 shows an example embodiment of the first pull-down transistor PD1 and the second pull-down transistor PD2 of FIG. 2, which will be described below with reference to FIG. 2.

Referring to FIG. 3, the first pull-down transistor PD1 may include a first sub-transistor PD11 and a second sub-transistor PD12. Drain terminals of the first sub-transistor PD11 and the second sub-transistor PD12 may be connected to each other, and source terminals of the first sub-transistor PD11 and the second sub-transistor PD12 may be connected to each other. The drain terminals of the first sub-transistor PD11 and the second sub-transistor PD12 may be connected to a first node (N1 of FIGS. 2 and 3), and a ground voltage may be applied to the source terminals of the first sub-transistor PD11 and the second sub-transistor PD12. Gates of the first sub-transistor PD11 and the second sub-transistor PD12 may be connected to a second node (N2 of FIGS. 2 and 3).

The second pull-down transistor PD2 may include a third sub-transistor PD21 and a fourth sub-transistor PD22. Drain terminals of the third sub-transistor PD21 and the fourth sub-transistor PD22 may be connected to each other, and source terminals of the third sub-transistor PD21 and the fourth sub-transistor PD22 may be connected to each other. The drain terminals of the third sub-transistor PD21 and the fourth sub-transistor PD22 may be connected to the second node (N2 of FIGS. 2 and 3), and a ground voltage may be applied to the source terminals of the third sub-transistor PD21 and the fourth sub-transistor PD22. Gates of the third sub-transistor PD21 and the fourth sub-transistor PD22 may be connected to the first node (N1 of FIGS. 2 and 3).

According to an example embodiment, as the first pull-down transistor PD1 and the second pull-down transistor PD2 include a plurality of transistors connected in parallel, the pull-down performance of the first pull-down transistor PD1 and the second pull-down transistor PD2 may be improved. For example, the first pull-down transistor PD1 may pull-down the voltage of the first node (N1 of FIGS. 2 and 3) to the ground voltage faster as compared to the case in which the first pull-down transistor PD1 includes one transistor, and the second pull-down transistor PD2 may pull-down the voltage of the second node (N2 of FIGS. 2 and 3) to the ground voltage faster as compared to the case in which the second pull-down transistor PD2 includes one transistor.

Hereinafter, the layout of the bit cell BC will be described with reference to FIGS. 2-4.

Figure 4:
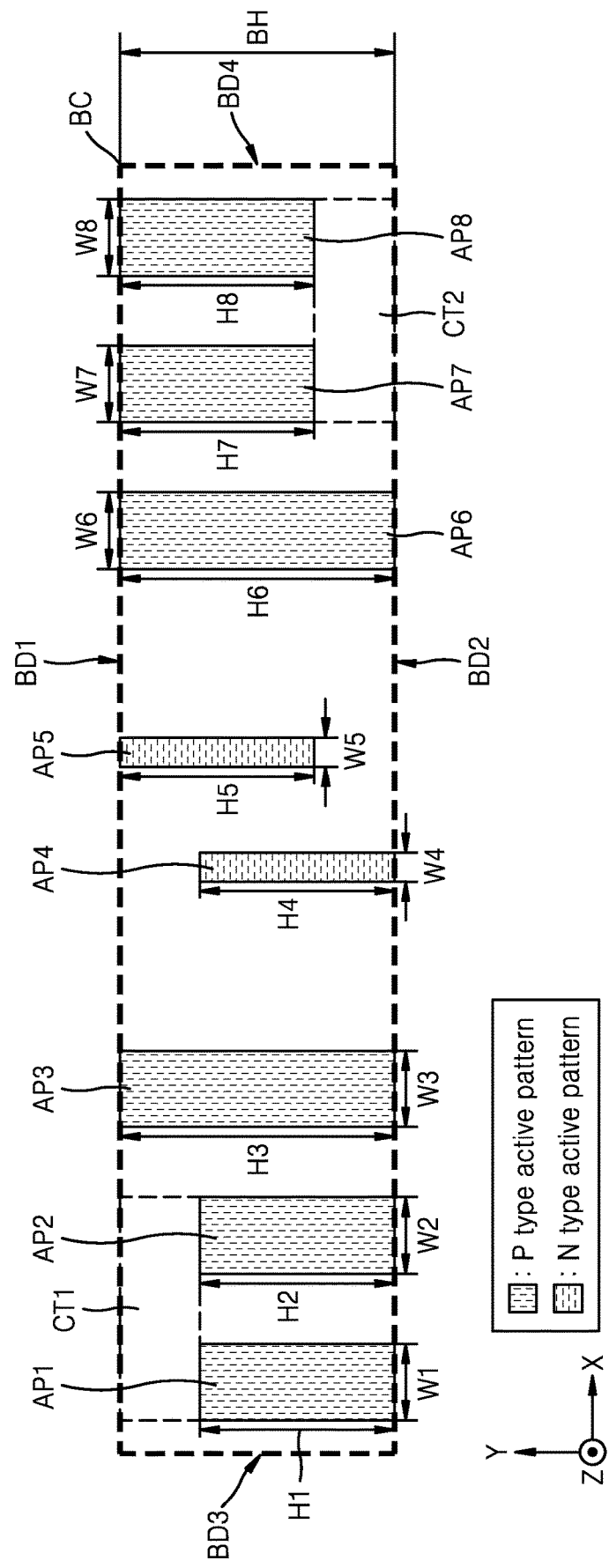
FIG. 4 is a layout diagram of a bit cell according to example embodiments.

FIG. 4 is a layout diagram of a bit cell according to example embodiments. In detail, FIG. 4 is a layout diagram for describing the arrangement of a plurality of active patterns of the bit cell BC of FIG. 2. Hereinafter, descriptions will be given with reference to FIG. 2.

Referring to FIG. 4, the bit cell BC may include (or bounded by) a first boundary BD1, a second boundary BD2 opposite to the first boundary BD1, a third boundary BD3 perpendicular to the first boundary BD1 and the second boundary BD2, and a fourth boundary BD4 opposite to the third boundary BD3. The bit cell BC may include first to eighth active patterns AP1 to AP8. The first to eighth active patterns AP1 to AP8 may be arranged to be sequentially spaced apart from one another in the first direction X. A first active pattern AP1 may be disposed closest to the third boundary BD3, and an eighth active pattern AP8 may be disposed closest to the fourth boundary BD4.

The first to eighth active patterns AP1 to AP8 may extend in the second direction Y. At least some of the first to eighth active patterns AP1 to AP8 may extend in the second direction Y and penetrate through the bit cell BC. For example, at least some of the first to eighth active patterns AP1 to AP8 may extend past one of the first boundary BD1 and the second boundary BD2. However, for convenience of explanation, the first to eighth active patterns AP1 to AP8 will be described as being provided between the first boundary BD1 and the second boundary BD2 of the bit cell BC. Therefore, the maximum height that the first to eighth active patterns AP1 to AP8 may have may be a height BH of the bit cell BC.

The first to eighth active patterns AP1 to AP8 may each be a P-type active pattern in which an N-type transistor is formed or an N-type active pattern in which a P-type transistor is formed. For example, first to third active patterns AP1 to AP3 and sixth to eighth active patterns AP6 to PA8 may be P-type active patterns, and fourth and fifth active patterns AP4 and AP5 may be N-type active patterns. Therefore, the first active pattern AP1 may be referred to as a 'first P-type active pattern', a second active pattern AP2 may be referred to as a 'second P-type active pattern', a third active pattern AP3 may be referred to as a 'third P-type active pattern', a fourth active pattern AP4 may be referred to as a 'first N-type active pattern', a fifth active pattern AP5 may be referred to as a 'second N-type active pattern', a sixth active pattern AP6 may be referred to as a 'fourth P-type active pattern', a seventh active pattern AP7 may be referred to as a 'fifth P-type active pattern', and the eighth active pattern AP8 may be referred to as a 'sixth P-type active pattern'.

The first to eighth active patterns AP1 to AP8 may have different widths in the first direction X. For example, a width W2 of the second active pattern AP2 in the first direction X may be greater than a width W3 of the third active pattern AP3 in the first direction X. A width W7 of the seventh active pattern AP7 in the first direction X may be greater than a width W6 of the sixth active pattern AP6 in the first direction X. A width W4 of the fourth active pattern AP4 in the first direction X may be smaller than the width W3 of the third active pattern AP3 in the first direction X.

However, example embodiments are not limited thereto, and the width W2 of the second active pattern AP2 in the first direction X may be equal to the width W3 of the third active pattern AP3 in the first direction X. The width W7 of the seventh active pattern AP7 in the first direction X may be equal to the width W6 of the sixth active pattern AP6 in the first direction X.

A width W1 of the first active pattern AP1 in the first direction X may be equal to a width W8 of the eighth active pattern AP8 in the first direction X. The width W2 of the second active pattern AP2 in the first direction X may be equal to the width W7 of the seventh active pattern AP7 in the first direction X. The width W3 of the third active pattern AP3 in the first direction X may be equal to the width W6 of the sixth active pattern AP6 in the first direction X. The width W4 of the fourth active pattern AP4 in the first direction X may be equal to a width W5 of the fifth active pattern AP5 in the first direction.

The first to eighth active patterns AP1 to AP8 may each be formed in a rectangular shape. The first to eighth active patterns AP1 to AP8 may each have a constant width from the first boundary BD1 of the bit cell BC to the second boundary BD2 opposite to the first boundary BD1. For example, the width W3 of the third active pattern AP3 in the first direction X may be constant from the first boundary BD1 to the second boundary BD2.

According to an example embodiment, by forming an active pattern having a constant width from the first boundary BD1 of the bit cell BC to the second boundary BD2, a layout optimized to a DPSRAM cell including a gate-all-around field effect transistor (GAAFET) or a fin field effect transistor (FinFET) may be provided.

The first active pattern AP1 and the second active pattern AP2 may be cut by a first cutting unit (i.e., first cutting area) CT1. As used herein, the term cutting unit may indicate an area of a substrate in which an active pattern is not formed. The first cutting unit CT1 may be disposed close to the first boundary BD1 of the bit cell BC. Therefore, a height H1 of the first active pattern AP1 and a height H2 of the second active pattern AP2 may be equal to each other and may be smaller than the height BH of the bit cell BC.

The eighth active pattern AP8 and the seventh active pattern AP7 may be cut by a second cutting unit (i.e., second cutting area) CT2. The second cutting unit CT2 may be disposed close to the second boundary BD2 of the bit cell BC. Therefore, a height H8 of the eighth active pattern AP8 and the height H7 of the seventh active pattern AP7 may be equal to each other and may be smaller than the height BH of the bit cell BC.

A height H3 of the third active pattern AP3 and the height H6 of the sixth active pattern AP6 may be equal to each other and may be equal to the height BH of the bit cell BC. A height H4 of the fourth active pattern AP4 and a height H5 of the fifth active pattern AP5 may be equal to each other and may be smaller than the height BH of the bit cell BC.

A plurality of transistors may be formed in the first to eighth active patterns AP1 to AP8. The transistors may include a FinFET formed by an active pattern extending in a fin-like shape and a gate electrode, a GAAFET formed by a plurality of nano-wires extending in parallel with one another and a gate electrode, or a multi-bridge channel FET (MBCFET) formed by a plurality of nano-sheets extending in parallel with one another and a gate electrode.

Also, the transistors may include a forksheet FET (ForkFET) in which nano-sheets for a P-type transistor and nano-sheets for an N-type transistor are separated from each other by a dielectric wall, and thus an N-type transistor and a P-type transistor have structures closer to each other. The transistors may include a vertical FET (VFET) including source/drain regions spaced apart from each other in the Z-axis direction and a gate electrode surrounding the channel region. Also, the transistors may include a complementary FET (CFET), a negative FET (NCFET), a carbon nanotube (CNT) FET, a bipolar junction transistor or other 3D transistors.

In the following description, the transistors are described as GAAFETs, but example embodiments are not limited thereto. The transistors will be described later in detail with reference to FIG. 6, and various layout patterns formed on active patterns will be described below with reference to FIG. 5.

Figure 5:
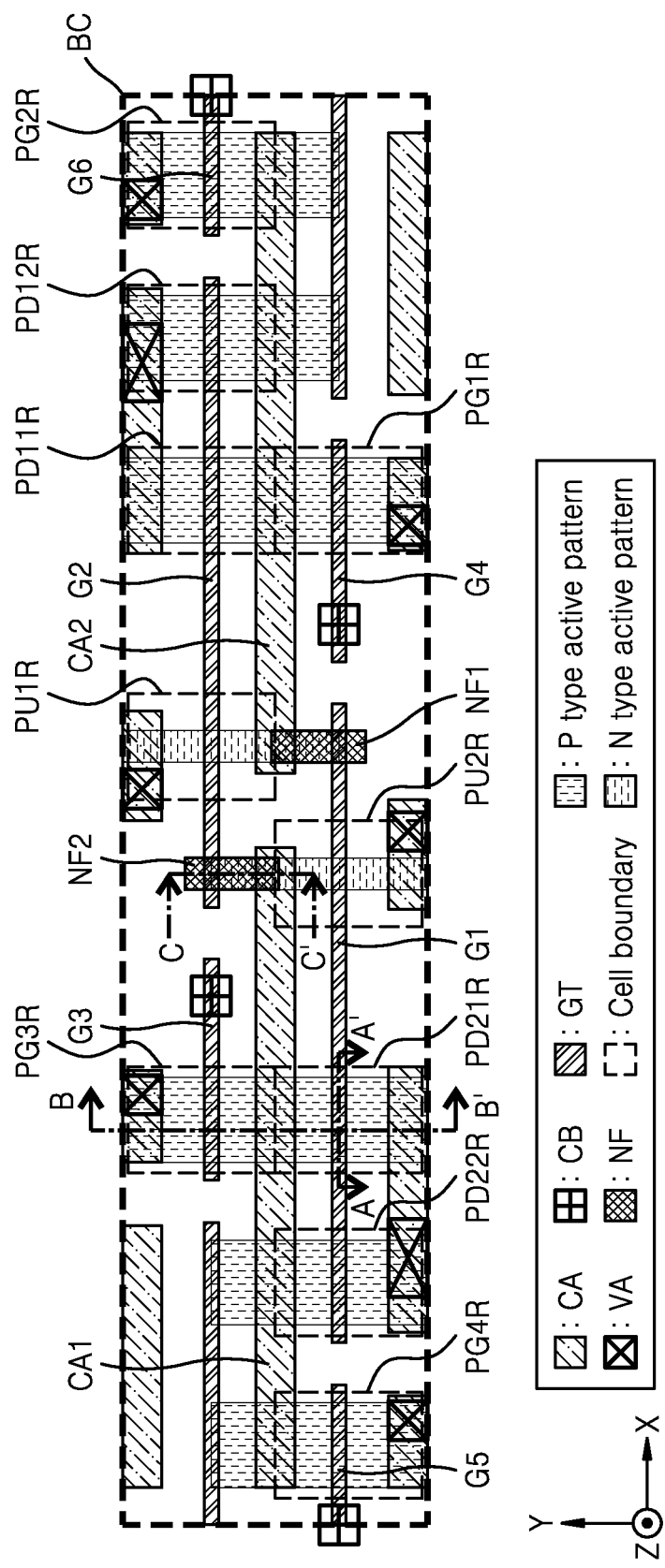
FIG. 5 is a layout diagram of a bit cell according to example embodiments.

FIG. 5 is a layout diagram of a bit cell according to example embodiments. In detail, FIG. 5 is a layout diagram showing various layout patterns formed on the first to eighth active patterns AP1 to AP8 of FIG. 4. Hereinafter, descriptions will be given with reference to FIGS. 2 to 4, and repeated descriptions will be omitted.

Referring to FIG. 5, the bit cell BC may include a first pass transistor region PG1R, a second pass transistor region PG2R, a third pass transistor region PG3R, a fourth pass transistor region PG4R, a first pull-up transistor region PU1R, a second pull-up transistor region PU2R, a first sub-transistor region PD11R, a second sub-transistor region PD12R, a third sub-transistor region PD21R, and a fourth sub-transistor region PD22R.

The first pass transistor region PG1R, the second pass transistor region PG2R, the third pass transistor region PG3R, the fourth pass transistor region PG4R, the first pull-up transistor region PU1R, the second pull-up transistor region PU2R, the first sub-transistor region PD11R, the second sub-transistor region PD12R, the third sub-transistor region PD21R, and the fourth sub-transistor region PD22R may be regions in which the first pass transistor PG1, the second pass transistor PG2, the third pass transistor PG3, the fourth pass transistor PG4, the first pull-up transistor PUT, the second pull-up transistor PU2, the first pull-down transistor PD1, and the second pull-down transistor PD2 are formed, respectively. For example, first pull-down transistors PD1 may be formed in the first sub-transistor region PD11R and the second sub-transistor region PD12R, and second pull-down transistors PD2 may be formed in the third sub-transistor region PD21R and the fourth sub-transistor region PD22R.

The first pass transistor region PG1R and the first sub-transistor region PD11R may be adjacent to each other in the second direction Y. The first pass transistor region PG1R and the first sub-transistor region PD11R may share the sixth active pattern (AP6 of FIG. 4). The first sub-transistor region PD11R and the second sub-transistor region PD12R may be spaced apart from each other in the first direction X. The first sub-transistor region PD11R may be formed on the sixth active pattern AP6, and the second sub-transistor region PD12R may be formed on the seventh active pattern AP7. An area of the first sub-transistor region PD11R may be equal to or smaller than an area of the second sub-transistor region PD12R.

The second pass transistor region PG2R may be spaced apart from the second sub-transistor region PD12R in the first direction X. The second pass transistor region PG2R may be formed on the eighth active pattern AP8. An area of the second pass transistor region PG2R may be equal to or smaller than the area of the second sub-transistor region PD12R.

The third pass transistor region PG3R and the third sub-transistor region PD21R may be adjacent to each other in the second direction Y. The third pass transistor region PG3R and the third sub-transistor region PD21R may share the third active pattern (AP3 of FIG. 4). The third sub-transistor region PD21R and the fourth sub-transistor region PD22R may be spaced apart from each other in the first direction X. The third sub-transistor region PD21R may be formed on the third active pattern AP3, and the fourth sub-transistor region PD22R may be formed on the second active pattern AP2. An area of the third sub-transistor region PD21R may be equal to or smaller than an area of the fourth sub-transistor region PD22R.

The fourth sub-transistor region PD22R and the fourth pass transistor region PG4R may be spaced apart from each other in the first direction X. The fourth pass transistor region PG4R may be formed on the first active pattern AP1. An area of the fourth pass transistor region PG4R may be equal to or smaller than the area of the fourth sub-transistor region PD22R.

The first pull-up transistor region PU1R may be disposed between the third pass transistor region PG3R and the first sub-transistor region PD11R, and the second pull-up transistor region PU2R may be disposed between the first pass transistor region PG1R and the third sub-transistor region PD21R. In detail, the first pull-up transistor region PU1R may be disposed relatively closer to the first sub-transistor region PD11R than the second pull-up transistor region PU2R, and the second pull-up transistor region PU2R may be disposed relatively closer to the third sub-transistor region PD21R than the first pull-up transistor region PU1R. The first pull-up transistor region PU1R and the second pull-up transistor region PU2R may be arranged on different axes in the second direction Y. The first pull-up transistor region PU1R and the second pull-up transistor region PU2R may be arranged adjacent to each other in the first direction X.

Gate electrodes GT may be spaced apart from one other in the second direction Y and may extend in the first direction X. The gate electrodes GT may partially overlap the first to eighth active patterns AP1 to AP8. The gate electrodes GT may have a structure corresponding to gate ends of transistors formed at the first to eighth active patterns AP1 to AP8. The gate electrodes GT and the first to eighth active patterns AP1 to AP8 may constitute a plurality of transistors.

A gate electrode GT extends in the first direction X, and may be include more than one segment. A voltage may be applied to the gate electrode GT through a gate contact CB. The gate electrode GT may include a conductive material. For example, the gate electrode GT may include at least one of a semiconductor material (e.g., doped silicon, doped germanium, doped silicon-germanium, etc.), a metal (e.g., tungsten, aluminum, etc.), a metal compound (e.g., a metal silicide, etc.), a conductive metal nitride (e.g., titanium nitride, tantalum nitride, tungsten nitride, etc.), or a transition metal (e.g., titanium, tantalum, etc.).

The gate electrodes GT may include first to sixth gate electrodes G1 to G6. A first gate electrode G1 may be formed to extend in the first direction X on second to fifth active patterns (AP2 to AP5 of FIG. 4). Therefore, the third sub-transistor (PD21 of FIG. 3), the fourth sub-transistor (PD22 of FIG. 3), and the second pull-up transistor (PU2 of FIG. 2) may share a gate. Thus, the same voltage may be applied to the third sub-transistor (PD21 of FIG. 3), the fourth sub-transistor (PD22 of FIG. 3), and the second pull-up transistor (PU2 of FIG. 2).

A second gate electrode G2 may be formed to extend in the first direction X on fourth to seventh active patterns (AP4 to AP7 of FIG. 4). The second gate electrode G2 may be spaced apart from the first gate electrode G1 in the second direction Y. Therefore, the first sub-transistor (PD11 of FIG. 3), the second sub-transistor (PD12 of FIG. 3), and the first pull-up transistor (PU1 of FIG. 2) may share a gate. Thus, the same voltage may be applied to the first sub-transistor (PD11 of FIG. 3), the second sub-transistor (PD12 of FIG. 3), and the first pull-up transistor (PU1 of FIG. 2).

A third gate electrode G3 may be formed on the third active pattern (AP3 of FIG. 4). The third gate electrode G3 may be disposed aligned with the second gate electrode G2 along the first direction X and may be spaced apart from the second gate electrode G2 in the first direction X. The third gate electrode G3 may be spaced apart from the first gate electrode G1 in the second direction Y. Therefore, the first gate electrode G1 and the third gate electrode G3 may be arranged side by side on the third active pattern (AP3 of FIG. 4).

The fourth gate electrode G4 may be formed on the sixth active pattern (AP6 of FIG. 4). The fourth gate electrode G4 may be disposed aligned with the first gate electrode G1 along the first direction X and may be spaced apart from the first gate electrode G1 in the first direction X. The fourth gate electrode G4 may be spaced apart from the second gate electrode G2 in the second direction Y. Therefore, the second gate electrode G2 and the fourth gate electrode G4 may be arranged side by side on the sixth active pattern (AP6 of FIG. 4).

A fifth gate electrode G5 may be formed on the first active pattern (AP1 of FIG. 4). The fifth gate electrode G5 may be disposed aligned with the first gate electrode G1 along the first direction X and may be spaced apart from the first gate electrode G1 in the first direction X.

A sixth gate electrode G6 may be formed on the eighth active pattern (AP8 of FIG. 4). The sixth gate electrode G6 may be disposed aligned with the second gate electrode G2 along the first direction X and may be spaced apart from the second gate electrode G2 in the first direction X.

Active contacts CA may be formed on the first to eighth active patterns (AP1 to AP8 of FIG. 4). An active contact CA may extend in the first direction X. The active contacts CA may be disposed between the gate electrodes GT along the second direction Y. The active contact CA may include a first active contact CA1 and a second active contact CA2.

The first active contact CA1 and the second active contact CA2 may be aligned along the first direction X and may be spaced apart from each other in the first direction X. First active contact CA1 may be formed on the first to fourth active patterns (AP1 to AP4 of FIG. 4). Second active contact CA2 may be formed on the fifth to eighth active patterns (AP5 to AP8 of FIG. 5).

An active via VA may be formed on the active contact CA. The active contact CA and the active via VA may be electrically connected to each other. The active contact CA and the active via VA may conduct a voltage provided to a source region and a drain region of a transistor to a source/drain region of the transistor.

The active contact CA and the gate electrode GT may be electrically connected to each other by a node formation pattern NF. The node formation pattern NF may provide a first node (N1 of FIGS. 2 and 3) or a second node (N2 of FIGS. 2 and 3) to the bit cell BC. The node formation pattern NF may extend in the second direction Y. The node formation pattern NF may include the same material as the active contact CA.

The node formation pattern NF may include a first node formation pattern NF1 and a second node formation pattern NF2. The first node formation pattern NF1 may connect the first gate electrode G1 and the second active contact CA2, and may extend in the second direction Y. The second node formation pattern NF2 may connect the second gate electrode G2 and the first active contact CA1, and may extend in the second direction Y. A first node (N1 of FIGS. 2 and 3) may be provided to the bit cell BC by forming the first node formation pattern NF1, and a second node (N2 of FIGS. 2 and 3) may be provided to the bit cell BC by forming the second node formation pattern NF2.

According to an example embodiment, in the first pull-down transistor PD1 and the second pull-down transistor PD2 of FIG. 2, a plurality of sub-transistors are arranged in parallel, at least one of a plurality of active patterns in which the sub-transistors are formed is cut by a cutting unit, and the active patterns in which the sub-transistors are formed have different widths in the first direction X, and thus an integrated circuit in which performance of pull-down transistors are improved may be provided. For example, the width W2 of the second active pattern (AP2 of FIG. 4) may be formed to be greater than the width W3 of the third active pattern (AP3 of FIG. 4) and first gate electrodes G1 may be formed on the second active pattern AP2 and the third active pattern AP3, thereby improving the pull-down performance of the second pull-down transistor (PD2 of FIG. 2).

Figure 6:
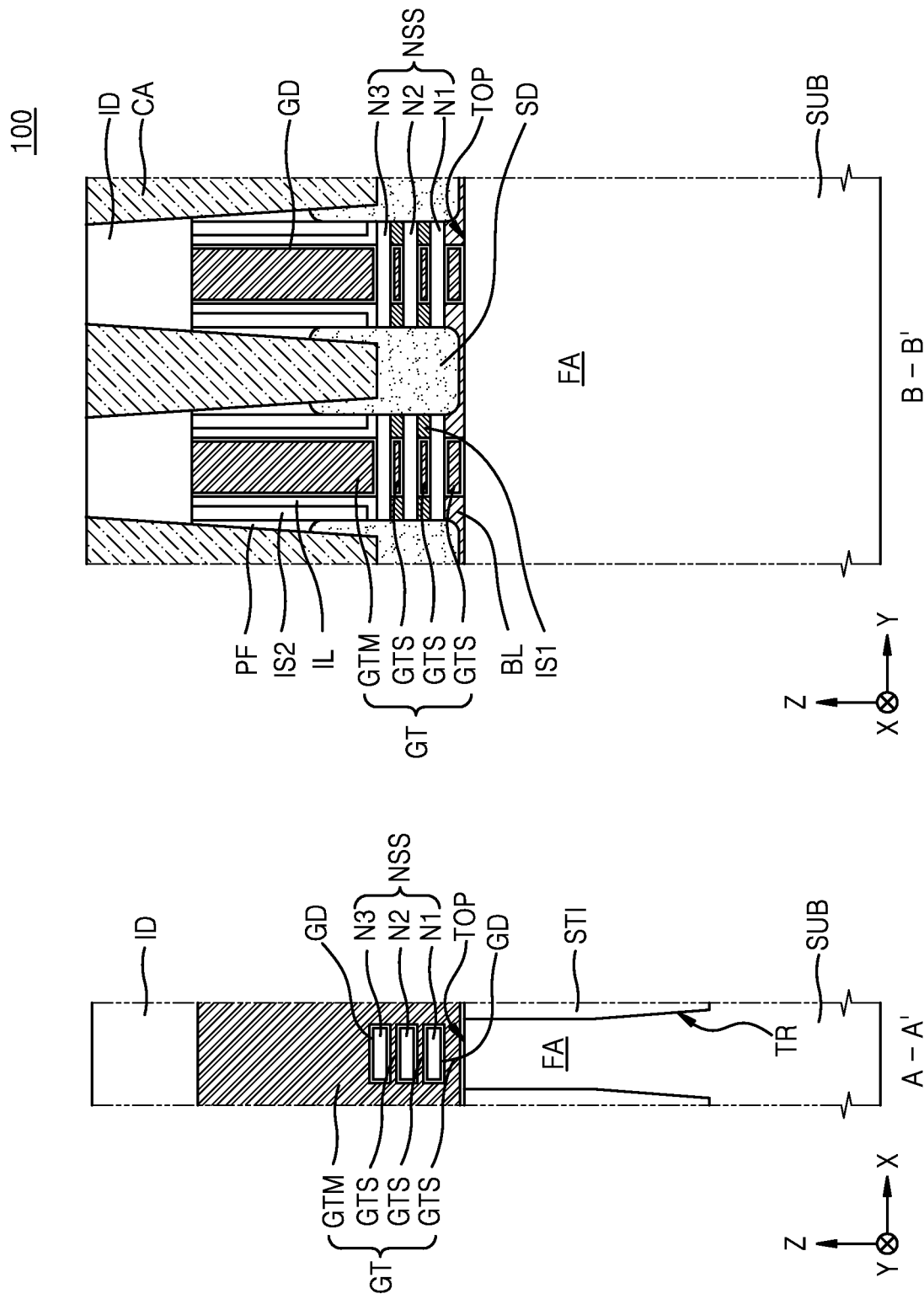
FIG. 6 illustrates cross-sectional views of a bit cell according to example embodiments.

FIG. 6 illustrates cross-sectional views of a bit cell according to an example embodiment. In detail, FIG. 6 is a diagram for helping understanding of the bit cell BC described above with reference to FIGS. 1 to 5 and illustrates cross-sectional views taken along lines A-A' and B-B' of FIG. 5. Hereinafter, descriptions will be given with reference to FIGS. 1 to 5, and repeated descriptions will be omitted.

The integrated circuit 10 of FIG. 6 may include a GAAFET, and the GAAFET may include an MBCFET. FIG. 6 is a diagram for describing GAAFETs formed on active patterns (AP1 to AP8 of FIG. 4), and more particularly, a diagram for describing an MBCFET. Therefore, although a nano-sheet is shown in FIG. 6, example embodiments are not limited thereto, and, according to another example embodiment, the nano-sheet may be implemented as a nano-wire. For convenience of explanation, in FIG. 6, an active contact (CA of FIG. 5), a gate contact (CB of FIG. 5), and an active via (VA of FIG. 5) are omitted.

Referring to FIG. 6, the integrated circuit 100 may include a fin-type active pattern FA that protrudes from a semiconductor substrate SUB and extends in the second direction Y. The semiconductor substrate SUB may include a conductive region, e.g., a well doped with an impurity or a structure doped with an impurity. The fin-type active pattern FA may correspond to the third active pattern (AP3 of FIG. 4) of FIG. 4.

A trench TR defining the fin-type active pattern FA may be formed in the semiconductor substrate SUB. The trench TR may be filled with a shallow trench isolation (STI) film STI. The STI film STI may include an insulation material.

A nano-sheet stacked structure NSS may be spaced apart from a top surface TOP of the fin-type active pattern FA in the third direction Z. The nano-sheet stacked structure NSS may face the top surface TOP of the fin-type active pattern FA at a position spaced apart from the top surface TOP of the fin-type active pattern FA in the third direction Z.

The nano-sheet stacked structure NSS may include nano-sheets N1, N2, and N3 extending in parallel with the top surface TOP of the fin-type active pattern FA. The nano-sheets N1, N2, and N3 may be sequentially stacked on the top surface TOP of the fin-type active pattern FA and may each have a channel region. The nano-sheets N1, N2, and N3 may include the same material as that constituting the semiconductor substrate SUB.

Although FIG. 6 shows that one nano-sheet stacked structure NSS and the gate electrode GT are formed on one fin-type active pattern FA and the nano-sheet stacked structure NSS includes the three stacked nano-sheets N1, N2, and N3, example embodiments are not limited thereto. Also, although FIG. 6 shows that the cross section of the nano-sheet stacked structure NSS is rectangular, example embodiments are not limited thereto, and the cross section of the nano-sheet stacked structure NSS may have various shapes.

The gate electrode GT may be formed on the fin-type active pattern FA. The gate electrode GT may extend in the first direction X. The gate electrode GT may cover the nano-sheet stacked structure NSS. The gate electrode GT may surround at least portions of the nano-sheets N1, N2, and N3.

A source/drain region SD may be formed over the fin-type active pattern FA. The source/drain region SD may be connected to one ends of the nano-sheets N1, N2, and N3 adjacent thereto.

The gate electrode GT may include a main gate electrode GTM covering the top surface of the nano-sheet stacked structure NSS and sub-gate electrodes GTS formed between the fin-type active pattern FA and the nano-sheets N1, N2, and N3. The main gate electrode GTM and the sub gate electrodes GTS may be connected to each other. The thickness of the main gate electrode GTM may be greater than the thickness of each of the sub-gate electrodes GTS.

Two sidewalls along the second direction Y of a sub-gate electrode GTS disposed closest to the fin-type active pattern FA from among the sub-gate electrodes GTS may be surrounded by a buffer layer BL covering the top surface TOP of the fin-type active pattern FA. The buffer layer BL may include a material different from that of the fin-type active pattern FA.

A gate dielectric layer GD may be formed between the nano-sheet stacked structure NSS and the gate electrode GT. The gate dielectric layer GD may cover a surface of each of the nano-sheets N1, N2, and N3. The gate dielectric layer GD may include a high-k material.

A first insulation spacer IS1 may be formed to cover at least portions of sidewalls of the sub-gate electrodes GTS. The first insulation spacer IS1 may be positioned between the sub-gate electrodes GTS and the source/drain region SD. First insulation spacers IS1 may be positioned between the nano-sheets N1, N2, and N3.

An insulation liner IL, a second insulation spacer IS2, and a protective film PF may be formed on the nano-sheet stacked structure NSS. The insulation liner IL, the second insulation spacer IS2, and the protective film PF may cover sidewalls of the main gate electrode GTM. The insulation liner IL may be formed on sidewalls of the gate electrode GT and partially cover the top surface of a nano-sheet N3 disposed at the highest level from among the nano-sheets N1, N2, and N3. The second insulation spacer IS2 may be formed on the insulation liner IL, and the protective film PF may be formed on the second insulation spacer IS2. In some example embodiments, the protective film PF may be omitted.

An interlayer insulation layer ID may be formed on the gate electrode GT. The interlayer insulation layer ID may include silicon oxide. Active contacts CA connected to the source/drain region SD by penetrating through the interlayer insulation layer ID and the protective film PF may be formed on the source/drain region SD. The active contact CA may include a metal, a conductive metal nitride, or a combination thereof. A voltage may be applied to the source/drain region SD through the active contact CA.

Figure 7:
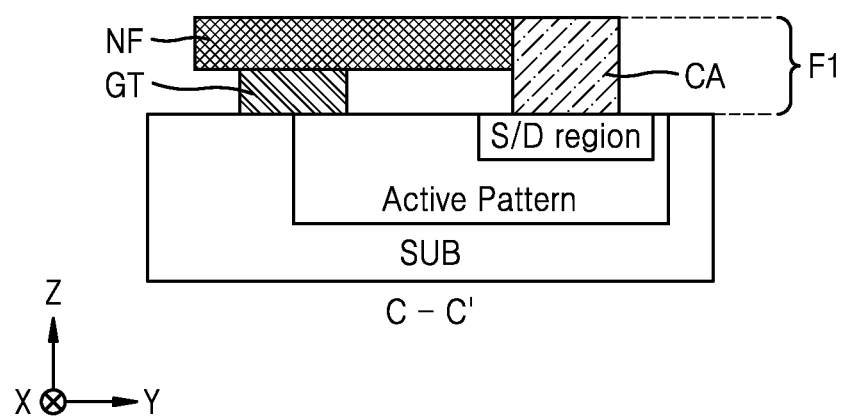
FIG. 7 is a cross-sectional view of a bit cell according to example embodiments.

FIG. 7 is a cross-sectional view of a bit cell according to an example embodiment. In detail, FIG. 7 is a schematic diagram for describing a stacked structure of FIG. 5 and is a cross-sectional view taken along a line C-C' of FIG. 5. Hereinafter, descriptions will be given with reference to FIG. 5, and sizes of the gate electrode GT, the active contact CA, and the node formation pattern NF are not limited to the illustrated sizes. Therefore, FIG. 7 may be different from an actual cross-sectional view of the bit cell BC.

Referring to FIG. 7, the active contact CA connected to the gate electrode GT and a source/drain region of a transistor may be formed in a first layer F1. The first layer F1 may be referred to as a 'contact layer' or a 'M0 layer'. The first layer F1 may be formed through a front end-of-line (FEOL) process. The gate electrode GT may correspond to the second gate electrode G2 of FIG. 5, the active contact CA may correspond to the first active contact CA1 of FIG. 5, and an active pattern may correspond to the fourth active pattern AP4 of FIG. 5.

The node formation pattern NF may be formed on the gate electrode GT. The node formation pattern NF may correspond to the second node formation pattern NF2 of FIG. 5. The node formation pattern NF may extend in the first direction X and be connected to the active contact CA. A width of the node formation pattern NF in the first direction X may be greater than a width of the gate electrode GT in the first direction X.

The node formation pattern NF and the active contact CA may include the same material. In some example embodiments, the node formation pattern NF and the active contact CA may be simultaneously formed. The level of the top surface of the node formation pattern NF may be identical to the level of the top surface of the active contact CA. Thus, the height of the active contact CA may be identical to the height of the first layer F1, and the sum of the height of the gate electrode GT and the height of the node formation pattern NF may be identical to the height of the first layer F1.

Hereinafter, a wiring structure formed over the first layer F1 will be further described.

Figure 8:
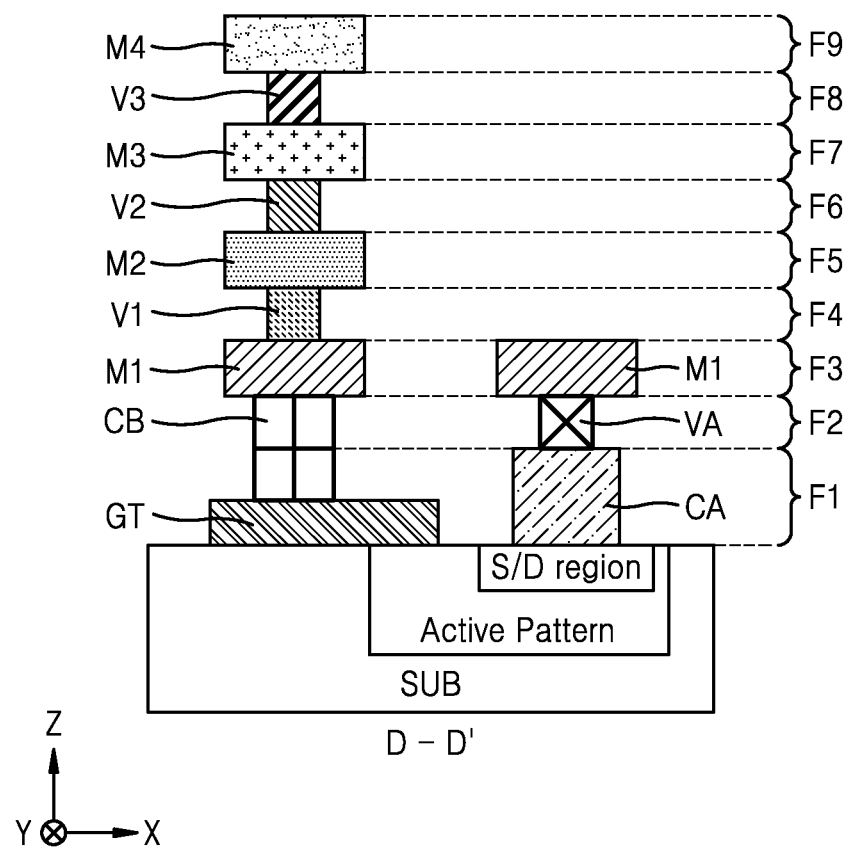
FIG. 8 is a cross-sectional view of a bit cell according to example embodiments.

FIG. 8 is a cross-sectional view of a bit cell according to an example embodiment. In detail, FIG. 8 is a schematic diagram for describing a stacked structure of metal wires of the bit cell BC of FIG. 2 and may be a cross-sectional view taken along a line D-D' of FIGS. 9 and 10, which will be described later. For convenience of explanation, transistors are omitted, and sizes of the gate electrode GT, the active contact CA, the gate contact CB, the active via VA, first to fourth metal wires M1 to M4, and first to third vias V1 to V3 are not limited to the illustrated sizes. Therefore, FIG. 8 may be different from an actual cross-sectional view of the bit cell BC. Hereinafter, descriptions will be given with reference to FIGS. 2 to 7, and repeated descriptions will be omitted.

Referring to FIG. 8, the gate electrode GT, the gate contact CB, and the active contact CA may be formed at the first layer F1. The gate contact CB may connect the gate electrode GT and a first metal wire M1. The active via VA connected to the active contact CA may be formed at a second layer F2. The second layer F2 may be referred to as a 'contact via layer' or a 'V0 layer'. The sum of heights of the gate electrode GT and the gate contact CB may be equal to the sum of heights of the active contact CA and the active via VA. As described later with reference to FIGS. 9 and 10, an active pattern may correspond to the first active pattern AP1 of FIG. 4, and the gate electrode GT may correspond to the fifth gate electrode G5 of FIG. 5.

The first metal wire M1 may be formed at a third layer F3. Metal wires M1 may be formed on the gate contact CB and the active via VA, respectively. As described later with reference to FIGS. 9 and 10, the first metal wire M1 formed on the gate contact CB may correspond to a first word line (WLA of FIG. 2), and the first metal wire M1 formed on the active via VA may correspond to a second word line (WLB of FIG. 2). The third layer F3 may be referred to as a 'first wire layer' or an 'M1 layer'.

A first via V1 may be formed at a fourth layer F4. The first via V1 may connect the first metal wire M1 and a second metal wire M2 to each other. The fourth layer F4 may be referred to as a 'first via layer'. The first via V1 may be formed on the gate electrode GT and not on the active contact CA.

The second metal wire M2 may be formed on a fifth layer F5. The fifth layer F5 may be referred to as a 'second wire layer' or an 'M2 layer'.

A second via V2 may be formed at a sixth layer F6. The second via V2 may connect the second metal wire M2 and a third metal wire M3 to each other. The sixth layer F6 may be referred to as a 'second via layer'.

The third metal wire M3 may be formed at a seventh layer F7. The seventh layer F7 may be referred to as a 'third wire layer' or an 'M3 layer'.

A third via V3 may be formed at an eighth layer F8. The third via V3 may connect the third metal wire M3 and a fourth metal wire M4. The eighth layer F8 may be referred to as a 'third via layer'.

The fourth metal wire M4 may be formed at a ninth layer F9. The ninth layer F9 may be referred to as a 'fourth wire layer' or an 'M4 layer'.

Second to ninth layers F2 to F9 may be formed through a back end-of-line (BEOL) process. A contact area may decrease in a direction from the second layer F2 to the ninth layer F9. Hereinafter, the layout of metal wires having the stacked structure of FIG. 8 will be described.

Figure 9:
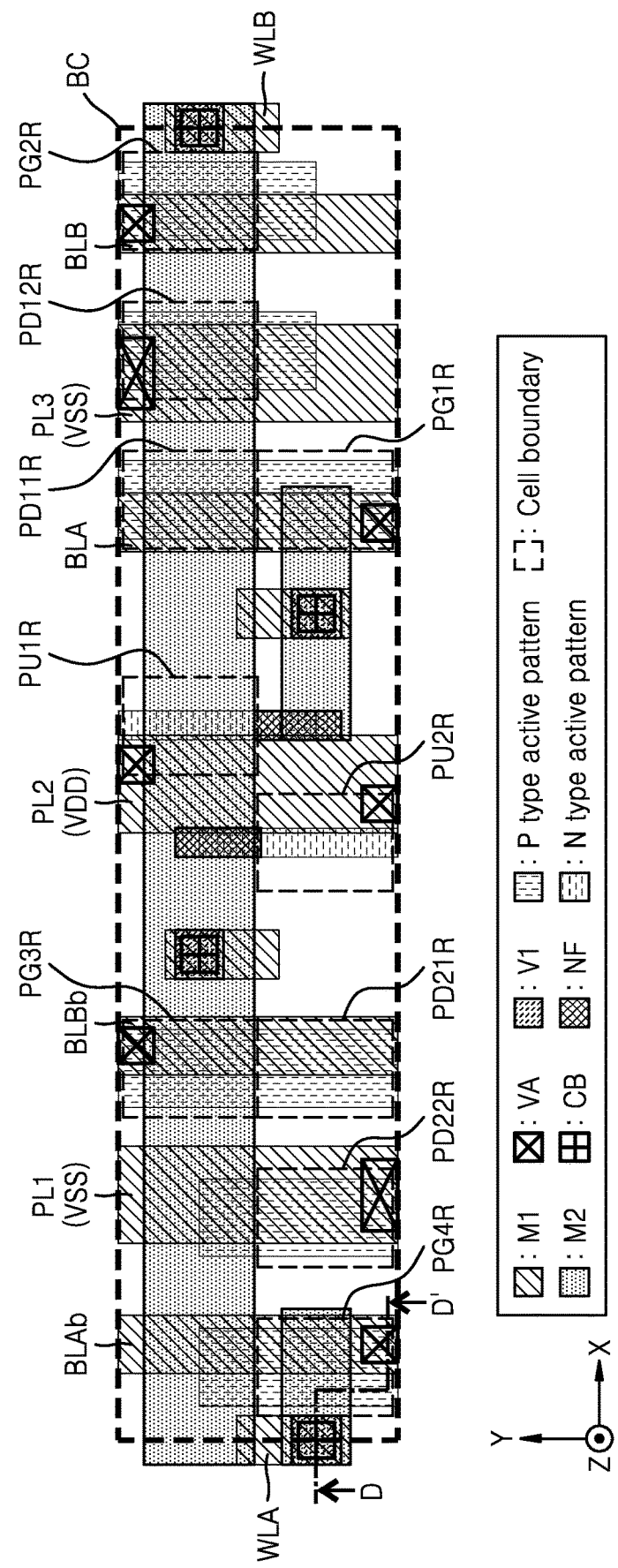
FIG. 9 is a layout diagram of a bit cell according to example embodiments.
Figure 10:
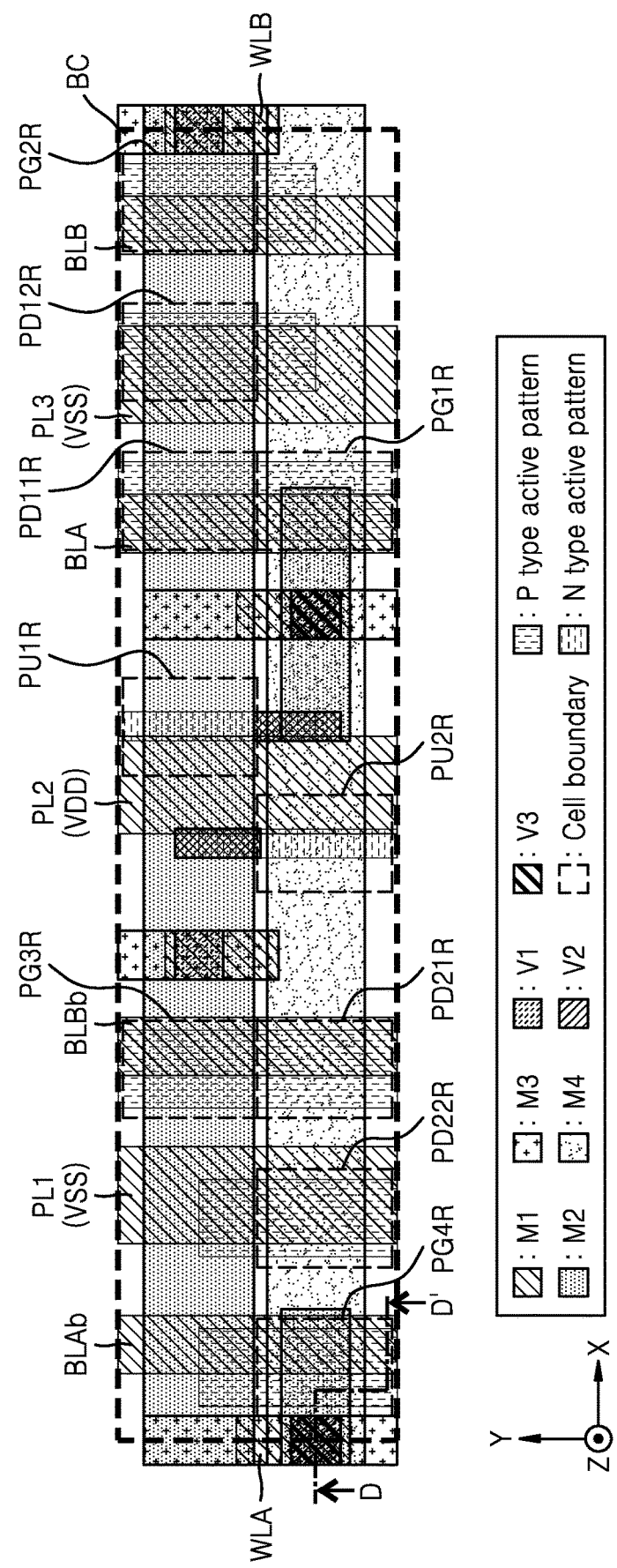
FIG. 10 is a layout diagram of a bit cell according to example embodiments.

FIGS. 9 and 10 are layout diagrams of a bit cell according to example embodiments. In detail, FIGS. 9 and 10 are layout diagrams of metal wires formed on the layout shown in FIG. 5 and having the stacked structure of FIG. 8. FIG. 9 is a layout diagram of metal wires corresponding to the first layer F1 to the fourth layer F4 of FIG. 8, and FIG. 10 is a layout diagram of the metal wires corresponds to the fifth layer F5 to the ninth layer F9 of FIG. 8. Hereinafter, descriptions will be given with reference to FIGS. 2 to 8.

Referring to FIG. 9, first metal wires M1 may be sequentially arranged and spaced apart from one another in the first direction X, and may be formed to extend in the second direction Y. Some of the first metal wires M1 may be formed to overlap first to eighth active patterns (AP1 to AP8 of FIG. 4).

The first metal wire M1 may include the first word line WLA, the first bit line bar BLAb, a first power line PL1, a second bit line bar BLBb, a second power line PL2, the first bit line BLA, a third power line PL3, the second bit line BLB, and the second word line WLB. The first word line WLA may be disposed closest to the third boundary (BD3 of FIG. 4) of the bit cell BC, and the second word line WLB may be disposed closest to the fourth boundary (BD4 of FIG. 4) of the bit cell BC. Also, the first word line WLA and the second word line WLB may be cut by a cutting unit. Therefore, heights of the first word line WLA and the second word line WLB in the bit cell BC may be less than heights of the first bit line BLA and the second bit line BLB.

First and third power lines PL1 and PL3 may apply the ground voltage VSS to at least some of the first to eighth active patterns (AP1 to AP8 of FIG. 4), and the second power line PL2 may apply the power voltage VDD to at least some of the first to eighth active patterns (AP1 to AP8 of FIG. 4).

The first via V1 may be formed on the first metal wire M1. The second metal wire M2 may be disposed on the first via V1. For convenience of illustration, the first via V1 may be illustrated despite of being positioned below the second metal wire M2. The first via V1 may connect the first metal wire M1 and the second metal wire M2 to each other.

Second metal wires M2 may be spaced apart from one another in the second direction Y and may extend in the first direction X. The second metal wires M2 may be formed on the first to eighth active patterns (AP1 to AP8 of FIG. 4).

Referring to FIG. 10, the second via V2 may be formed on the second metal wire M2. The third metal wire M3 may be disposed on the second via V2. For convenience of illustration, the second via V2 may be illustrated despite of being positioned below the third metal wire M3. The second via V2 may connect the second metal wire M2 and the third metal wire M3 to each other.

The third metal wire M3 may extend in the second direction Y. Third metal wires M3 may be formed between the first to eighth active patterns (AP1 to AP8 of FIG. 4).

The third via V3 may be formed on the third metal wire M3. The fourth metal wire M4 may be disposed on the third via V3. For convenience of illustration, the third via V3 may be illustrated despite of being positioned below the fourth metal wire M4. The third via V3 may connect the third metal wire M3 and the fourth metal wire M4 to each other.

The fourth metal wire M4 may extend in the first direction X. Fourth metal wires M4 may be formed on the first to eighth active patterns (AP1 to AP8 of FIG. 4). The second metal wire M2 may be disposed close to the second boundary (BD2 of FIG. 4) of the bit cell BC.

Figure 11:
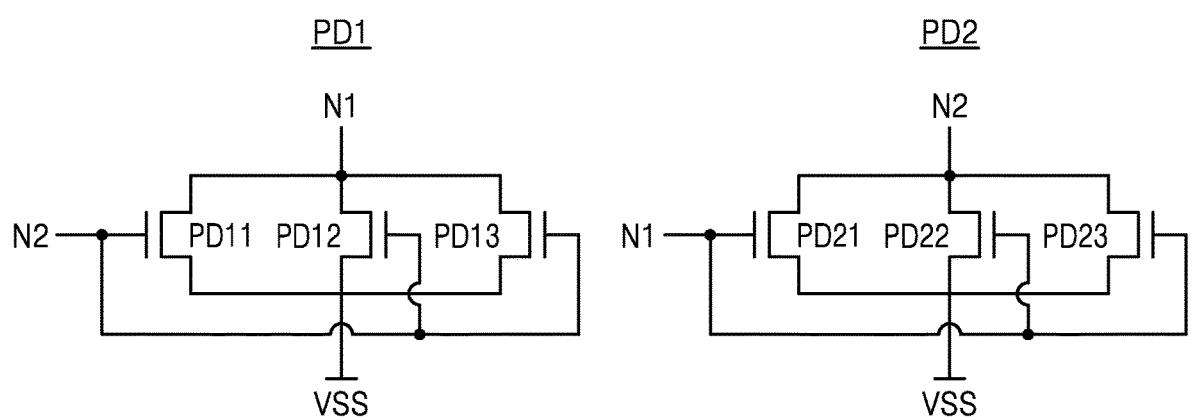
FIG. 11 illustrates circuit diagrams of pull-down transistors according to example embodiments.
Figure 12:
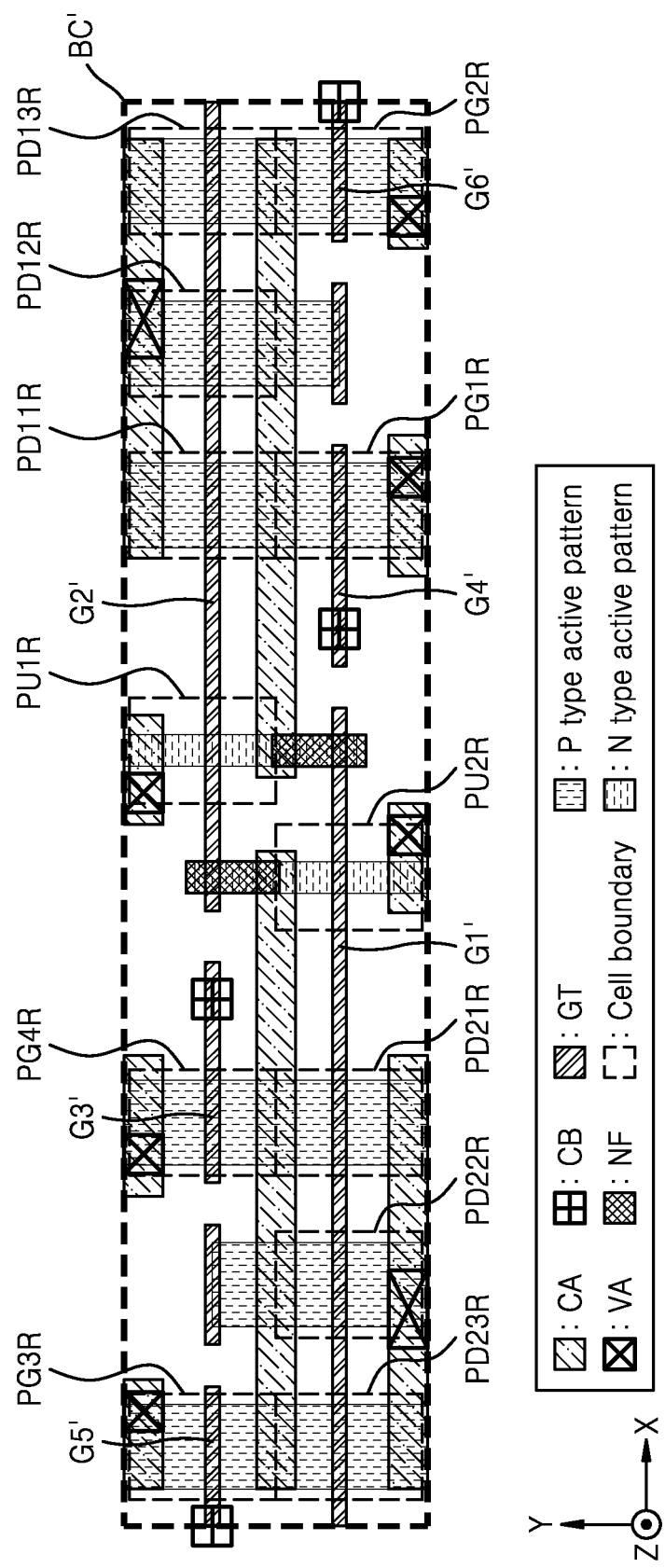
FIG. 12 is a layout diagram of a bit cell according to example embodiments.

FIGS. 11 and 12 are diagrams showing additional examples of bit cells according to example embodiments. In detail, FIG. 11 illustrates circuit diagrams of pull-down transistors according to another example embodiment of that of FIG. 3, and FIG. 12 is a layout diagram of a bit cell based on FIG. 11 according to another example embodiment of that of FIG. 5. Hereinafter, descriptions will be given with reference to FIGS. 2 to 5, and repeated descriptions will be omitted.

Referring to FIG. 11, the first pull-down transistor (PD1 of FIG. 2) may include the first sub-transistor PD11, the second sub-transistor PD12, and a third sub-transistor PD13. The first pull-down transistor PD1 of FIG. 11 may be configured by connecting three transistors in parallel, unlike the first pull-down transistor PD1 of FIG. 3.

Drain terminals of the first sub-transistor PD11, the second sub-transistor PD12, and the third sub-transistor PD13 may be connected to the first node (N1 of FIGS. 2 and 11), and a ground voltage may be applied to source terminals of the first sub-transistor PD11, the second sub-transistor PD12, and the third sub-transistor PD13. Gates of the first sub-transistor PD11, the second sub-transistor PD12, and the third sub-transistor PD13 may be connected to the second node (N2 of FIGS. 2 and 11).

The second pull-down transistor (PD2 of FIG. 2) may include a fourth sub-transistor PD21, a fifth sub-transistor PD22, and a sixth sub-transistor PD23. The second pull-down transistor PD2 of FIG. 11 may be configured by connecting three transistors in parallel, unlike the second pull-down transistor PD2 of FIG. 3.

Drain terminals of the fourth sub-transistor PD21, the fifth sub-transistor PD22, and the sixth sub-transistor PD23 may be connected to the second node (N2 of FIGS. 2 and 3), and a ground voltage may be applied to source terminals of the fourth sub-transistor PD21, the fifth sub-transistor PD22, and the sixth sub-transistor PD23. Gates of the fourth sub-transistor PD21, the fifth sub-transistor PD22, and the sixth sub-transistor PD23 may be connected to the first node (N1 of FIGS. 2 and 3).

According to an example embodiment, as the first pull-down transistor PD1 and the second pull-down transistor PD2 include a plurality of transistors connected in parallel, the pull-down performance of the first pull-down transistor PD1 and the second pull-down transistor PD2 may be improved. The first pull-down transistor PD1 may pull-down the voltage of the first node (N1 of FIGS. 2 and 3) to the ground voltage faster as compared to the case in which the first pull-down transistor PD1 includes one transistor, and the second pull-down transistor PD2 may pull-down the voltage of the second node (N2 of FIGS. 2 and 3) to the ground voltage faster as compared to the case in which the second pull-down transistor PD2 includes one transistor.

Referring to FIG. 12, the bit cell BC' may include the first pass transistor region PG1R, the second pass transistor region PG2R, the third pass transistor region PG3R, the fourth pass transistor region PG4R, the first pull-up transistor region PU1R, the second pull-up transistor region PU2R, the first sub-transistor region PD11R, the second sub-transistor region PD12R, a third sub-transistor region PD13R, a fourth sub-transistor region PD21R, a fifth sub-transistor region PD22R, and a sixth sub-transistor region PD23R.

First to third sub-transistor regions PD11R to PD13R may be regions in which first to third sub-transistors PD11 to PD13 described above with reference to FIG. 11 are formed, and fourth to sixth sub-transistor regions PD21R to PD23R may be regions in which fourth to sixth sub-transistors PD21 to PD23 described above with reference to FIG. 11 are formed. First pull-down transistors (PD1 of FIG. 11) may be formed in the first to third sub-transistor regions PD11R to PD13R, and second pull-down transistors (PD2 of FIG. 11) may be formed in the fourth to sixth sub-transistor regions PD21R to PD23R.

The first to third sub-transistor regions PD11R to PD13R may be spaced apart from one another in the first direction X. The first sub-transistor region PD11R may be formed on the sixth active pattern (AP6 of FIG. 4), the second sub-transistor region PD12R may be formed on the seventh active pattern (AP7 of FIG. 4), and the third sub-transistor region PD13R may be formed on the eighth active pattern (AP8 of FIG. 4). The width of the seventh active pattern (AP7 of FIG. 4) in the first direction X may be greater than the width of each of sixth and eighth active patterns (AP6 and AP8 of FIG. 4) in the first direction X.

Unlike the eighth active pattern AP8 of FIG. 4, the eighth active pattern AP8 of FIG. 12 may not be cut by the second cutting unit (CT2 of FIG. 4). Therefore, the eighth active pattern AP8 of FIG. 12 may have the same height as the height (BH of FIG. 4) of a bit cell BC', unlike the eighth active pattern AP8 of FIG. 4.

The second pass transistor region PG2R may be adjacent to the third sub-transistor region PD13R in the second direction Y. The second pass transistor region PG2R may be formed on the eighth active pattern AP8 that is not cut by the second cutting unit (CT2 of FIG. 4). The second pass transistor region PG2R and the third sub-transistor region PD13R may share the eighth active pattern AP8 that is not cut by the second cutting unit (CT2 of FIG. 4). An area of the second pass transistor region PG2R may be equal to or smaller than the area of the third sub-transistor region PD13R.

The fourth to sixth sub-transistor regions PD21R to PD23R may be spaced apart from one another in the first direction X. The fourth sub-transistor region PD21R may be formed on the third active pattern (AP3 of FIG. 4), the fifth sub-transistor region PD22R may be formed on the second active pattern (AP2 of FIG. 4), and the sixth sub-transistor region PD23R may be formed on the first active pattern (AP1 of FIG. 4). The width of the second active pattern (AP2 of FIG. 4) in the first direction X may be wider than the width of each of first and third active patterns (AP1 and AP3 of FIG. 4) in the first direction X.

Unlike the first active pattern AP1 of FIG. 4, the first active pattern AP1 of FIG. 12 may not be cut by the first cutting unit (CT1 of FIG. 4). Therefore, the first active pattern AP1 of FIG. 12 may have the same height as the height (BH of FIG. 4) of the bit cell BC', unlike the first active pattern AP1 of FIG. 4.

The third pass transistor region PG3R may be adjacent to the sixth sub-transistor region PD23R in the second direction Y. The third pass transistor region PG3R may be formed on the first active pattern AP1 that is not cut by the first cutting unit (CT1 of FIG. 4). The third pass transistor region PG3R and the sixth sub-transistor region PD23R may share the first active pattern AP1 that is not cut by the first cutting unit (CT1 of FIG. 4). An area of the third pass transistor region PG3R may be equal to or smaller than the area of the sixth sub-transistor region PD23R.

The gate electrodes GT may be spaced apart from one other in the second direction Y and may extend in the first direction X. The gate electrodes GT may include first to sixth gate electrodes G1' to G6'. A first gate electrode G1' may be formed to extend in the first direction X on first to fourth active patterns (AP1 to AP4 of FIG. 4). Therefore, the fourth to sixth sub-transistors (PD21 to PD23 of FIG. 11) and the second pull-up transistor (PU2 of FIG. 2) may share a gate. Because third to sixth sub-transistors (PD21 to PD23 of FIG. 11) may constitute the second pull-down transistor (PD2 of FIG. 2), the same voltage may be applied to the second pull-down transistor (PD2 of FIG. 2) and the second pull-up transistor (PU2 of FIG. 2).

A second gate electrode G2' may be formed to extend in the first direction X on fourth to eighth active patterns (AP4 to AP8 of FIG. 4). Therefore, the first to third sub-transistors PD11 to PD13 and the first pull-up transistor (PU1 of FIG. 2) may share a gate. Because the first to third sub-transistors (PD11 to PD13 of FIG. 11) may constitute the first pull-down transistor (PD1 of FIG. 11), the same voltage may be applied to the first pull-down transistor (PD1 of FIG. 2) and the first pull-up transistor (PU1 of FIG. 2).

A third gate electrode G3' may be formed on the third active pattern (AP3 of FIG. 4), and a fourth gate electrode G4' may be formed on the sixth active pattern (AP6 of FIG. 4). Third and fourth gate electrodes G3' and G4' may have the same configuration as third and fourth gate electrodes G3 and G4 of FIG. 5.

A fifth gate electrode G5' may be formed on the first active pattern (AP1 of FIG. 4) that is not cut by the first cutting unit (CT1 of FIG. 4). The fifth gate electrode G5' may be aligned with the third gate electrode G3' along the first direction X and may be spaced apart from the third gate electrode G3' in the first direction X. The fifth gate electrode G5' may be spaced apart from the first gate electrode G1' in the second direction Y. Therefore, the first gate electrode G1' and the fifth gate electrode G5' may be arranged side by side on the first active pattern (AP1 of FIG. 4) that is not cut by the first cutting unit (CT1 of FIG. 4).

A sixth gate electrode G6' may be formed on the eighth active pattern (AP8 of FIG. 4) that is not cut by the second cutting unit (CT2 of FIG. 4). The sixth gate electrode G6' may be aligned with the fourth gate electrode G4' along the first direction X and may be spaced apart from the fourth gate electrode G4' in the first direction X. The sixth gate electrode G6' may be spaced apart from the second gate electrode G2' in the second direction Y. Therefore, the second gate electrode G2' and the sixth gate electrode G6' may be arranged side by side on the eighth active pattern (AP8 of FIG. 4) that is not cut by the second cutting unit (CT2 of FIG. 4).

Active contacts CA may be formed on the first to eighth active patterns (AP1 to AP8 of FIG. 4). An active contact CA may extend in the first direction X. The active contacts CA may be disposed between the gate electrodes GT along the second direction Y.

The active contact CA and the gate electrode GT may be electrically connected to each other by a node formation pattern NF. The node formation pattern NF may provide a first node (N1 of FIG. 2) or a second node (N2 of FIG. 2) to the bit cell BC. The node formation pattern NF may extend in the second direction Y. The node formation pattern NF may include the same material as the active contact CA.

According to an example embodiment, in each of the first pull-down transistor PD1 and the second pull-down transistor PD2 of FIG. 2, three sub-transistors are arranged in parallel, at least one of a plurality of active patterns in which the sub-transistors are formed is cut by cutting unit, and the active patterns in which the sub-transistors are formed have different widths in the first direction X, and thus an integrated circuit in which performance of pull-down transistors are improved may be provided. For example, with reference to FIG. 4, the width W2 of the second active pattern (AP2 of FIG. 4) may be formed to be greater than the width W3 of the third active pattern (AP3 of FIG. 4) and first gate electrodes G1 may be formed on the first active pattern AP1, the second active pattern AP2, and the third active pattern AP3, thereby improving the pull-down performance of the second pull-down transistor (PD2 of FIG. 11).

Figure 13:
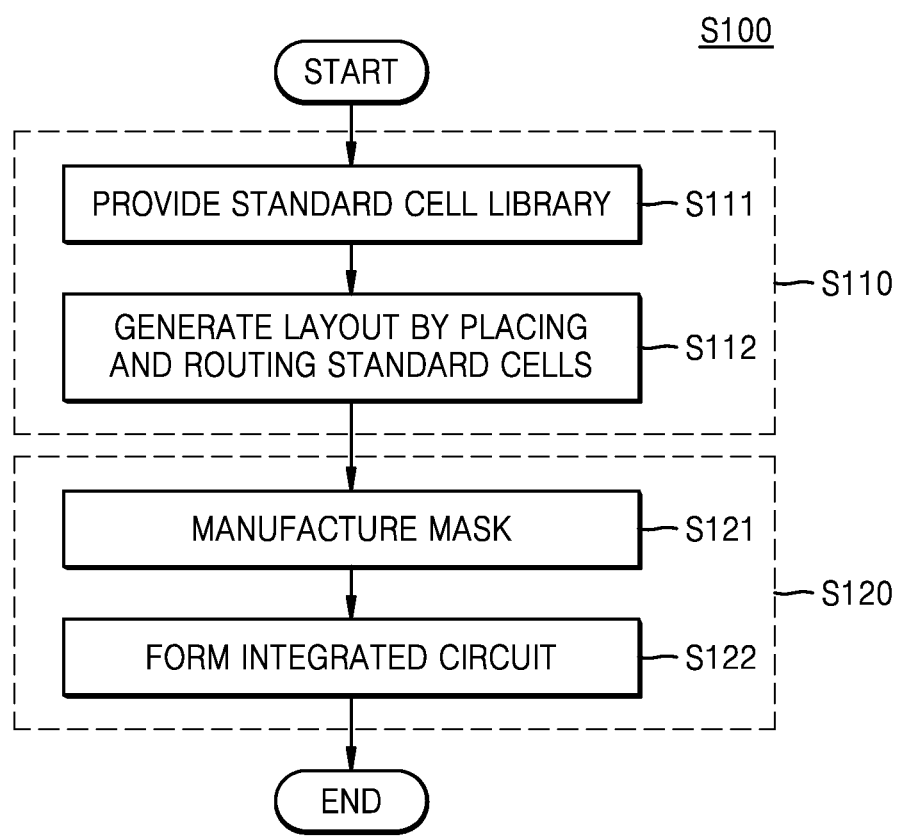
FIG. 13 is a flowchart of a method of manufacturing an integrated circuit, according to example embodiments.

FIG. 13 is a flowchart of a method of manufacturing an integrated circuit according to an example embodiment. The integrated circuit manufactured according to the method of FIG. 13 may be an integrated circuit including the bit cell BC described above with reference to FIGS. 2 to 12. Hereinafter, descriptions will be given with reference to FIGS. 1 to 13.

An integrated circuit may include a plurality of cells and may be designed by using a cell library including characteristic information regarding the cells. In the cell library, cell names, cell dimensions, gate widths, pins, delay characteristics, leakage currents, threshold voltages, functions, etc., may be defined. A common cell library may include basic cells such as an AND cell, an OR cell, a NOR cell, and an inverter cell, complex cells such as an OR/AND/INVERTER (OAI) cell and an AND/OR/INVERTER (AOI) cell, and a storage element such as a master-slave flip-flop and a latch.

In example embodiments described below, the cell library may be a standard cell library. A standard cell method may refer to a method of designing a dedicated large-scale integrated circuit (LSI) customized to the specifications of a customer or a user by preparing logic circuit blocks (or cells) having various functions in advance and combining these logic circuit blocks (or cells). Cells are designed and verified in advance and registered to a computer, and logical design, placement, and routing may be performed by combining cells using computer aided design (CAD).

In detail, in the case of designing/manufacturing a large-scale integrated circuit, when standardized logic circuit blocks (or cells) of a certain size are already stored in a library, an entire circuit may be formed by selecting logic circuit blocks suitable for a current design purpose from among the standardized logic circuit blocks, arranging selected logic circuit blocks as a plurality of cell rows on a chip, and forming optimal wires with the shortest lengths in wiring spaces between cells. The more the types of cells stored in the library, the greater the design flexibility and the possibility of an optimal design of a chip may be.

Referring to FIG. 13, a method S100 of manufacturing an integrated circuit according to example embodiments may be divided into operation S110 in which an integrated circuit is designed, and operation S120 in which the integrated circuit is manufactured.

Operation S110 of designing an integrated circuit is an operation of designing a layout for the integrated circuit and may be performed by a tool for designing an integrated circuit. The tool for designing an integrated circuit may be a program including a plurality of instructions to be executed by a processor. Therefore, operation S110 of designing an integrated circuit may be referred to as a computer-implemented method for designing an integrated circuit. Operation S120 of manufacturing an integrated circuit is an operation of manufacturing a semiconductor device according to an integrated circuit based on a designed layout and may be performed by a semiconductor process module.

Operation S110 of designing an integrated circuit may include operations S111 and S112.

In operation S111, a standard cell library may be provided. The standard cell library may include information regarding a plurality of standard cells. The standard cell library may include layout information and timing information regarding standard cells. The standard cell library may be stored in a computer-readable recording medium. According to an example embodiment, operation S111 may include generating a standard cell library, and more particularly, designing a standard cell.

Standard cells or an integrated circuit formed by standard cells may include a structure in which a plurality of layers are stacked, and the layers may each include a plurality of patterns.

In operation S112, a layout may be designed by placing and routing (P&R) standard cells by using the standard cell library. In detail, input data defining an integrated circuit may be received. The input data may be data synthesized by using a standard cell library from an abstract form of an integrated circuit behavior (e.g., data defined at a register transfer level (RTL)). The input data may be a bitstream or a net list generated by synthesizing integrated circuits defined in a hardware description language such as a VHSIC hardware description language (VHDL) and a Verilog. In operation S112, layouts of bit cells BC and BC' described with reference to FIGS. 4, 5, 9, 10, and 12 may be designed.

Subsequently, a recording medium (e.g., a non-transitory computer readable storage medium) having stored thereon a standard cell library may be accessed, and standard cells selected according to the input data from among a plurality of standard cells stored in the standard cell library may be placed and routed. Placing and routing may refer to an operation of placing selected standard cells and connecting the arranged standard cells. As placing and routing is completed, a layout for an integrated circuit may be generated.

Although it is illustrated that operation S110 of designing an integrated circuit includes operations S111 and S112, example embodiments are not limited thereto, and various operations according to a general method of designing an integrated circuit, such as modification of a standard cell library, verification of a layout, and post simulation, may be further included.

Operation S120 of manufacturing an integrated circuit may include operations S121 and S122.

In operation S121, a mask may be manufactured based on a layout. An optical proximity correction (OPC) may be performed based on the layout, wherein the OPC may refer to a process of changing a layout by reflecting an error due to an optical proximity effect. Subsequently, a mask may be manufactured according to a layout changed according to a result of performing the OPC. In this case, a mask may be manufactured by using a layout reflecting the OPC, e.g., a graphic design system (GDS) reflecting the OPC. Here, the number of manufactured masks may correspond to the number of colors allocated to patterns included in a layout.

In operation S122, an integrated circuit may be formed by using the manufactured mask. The integrated circuit may be formed by performing various semiconductor processes on a semiconductor substrate such as a wafer by using the mask manufactured in operation S121. For example, a process using the mask may refer to a patterning process through lithography. A desired pattern may be formed on a semiconductor substrate or a material layer through such a patterning process. The semiconductor processes may include a deposition process, an etching process, an ion process, a cleaning process, etc. Here, the deposition process may include various material layer forming processes such as CVD, sputtering, and spin coating. The ion process may include processes such as ion implantation, diffusion, heat treatment, etc. Also, the semiconductor process may include a packaging process for mounting a semiconductor device on a PCB and sealing the semiconductor device with a sealing material or may include a test process for testing a semiconductor device or a package.

Figure 14:
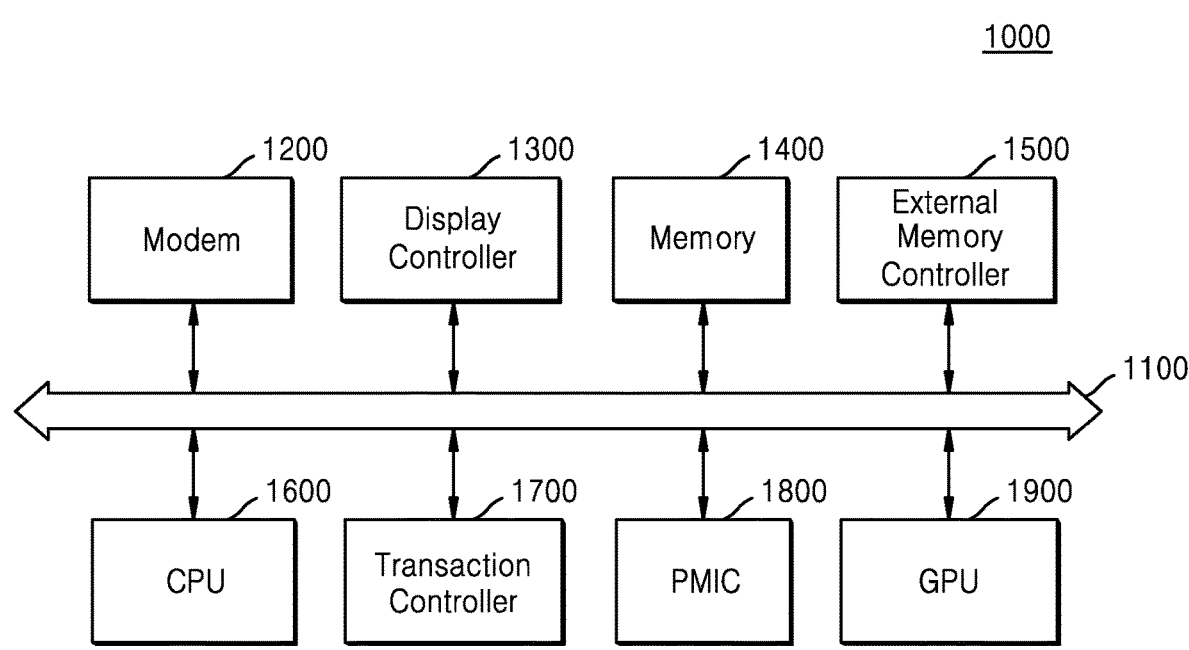
FIG. 14 is a block diagram showing a system-on-chip (SOC) including an integrated circuit according to an example embodiment.

FIG. 14 is a block diagram showing a system-on-chip (SOC) according to an example embodiment.

An SOC 1000 is a semiconductor device and may include an integrated circuit according to an example embodiment. The SOC 1000 is an implementation of complex functional blocks such as an intellectual property (IP) that performs various functions in a single chip, and bit cells arranged according to example embodiments may be included in functional blocks of the SOC 1000. For example, an IP block may include circuitry to perform specific functions, and may have a design that includes a trade secret.

Referring to FIG. 14, the SOC 1000 may include circuitry to implement a modem 1200, a display controller 1300, a memory 1400, an external memory controller 1500, a central processing unit (CPU) 1600, a transaction controller 1700, a PMIC 1800, and a graphic processing unit (GPU) 1900, each of which may communicate with one another through a system bus 1100.

The CPU 1600 may control operation of the SOC 1000, and may control operations of the modem 1200, the display controller 1300, the memory 1400, the external memory controller 1500, the transaction controller 1700, the PMIC 1800, and GPU 1900. The modem 1200 may demodulate signals received from the outside of the SOC 1000 or modulate signals generated inside the SOC 1000 and transmit modulated signals to the outside. The external memory controller 1500 may control operations for transmitting and receiving data to and from an external integrated circuit connected to the SOC 1000. For example, programs and/or data stored in an external integrated circuit may be provided to the CPU 1600 or the GPU 1900 under the control of the external memory controller 1500. The GPU 1900 may execute program instructions related to graphics processing. The GPU 1900 may receive graphics data through the external memory controller 1500 or transmit graphics data processed by the GPU 1900 to the outside of the SOC 1000 through the external memory controller 1500. The transaction controller 1700 may monitor data transactions of components of the SOC 1000, and the PMIC 1800 may control power supplied to other components under the control of the transaction controller 1700. The display controller 1300 may control a display (or a display device) outside the SOC 1000, and may transmit data generated inside the SOC 1000 to the display.

The memory 1400 may include a non-volatile memory, such as an electrically erasable/programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), and a ferroelectric random access memory (FRAM), or a volatile memory, such as a dynamic random access memory (DRAM, a static random access memory (SRAM), a mobile DRAM, a double data rate (DDR) synchronous dynamic random access memory (SDRAM), a low power DDR (LPDDR) SDRAM, a graphic DDR (GDDR) SDRAM, and a Rambus dynamic random access memory (RDRAM).

Figure 15:
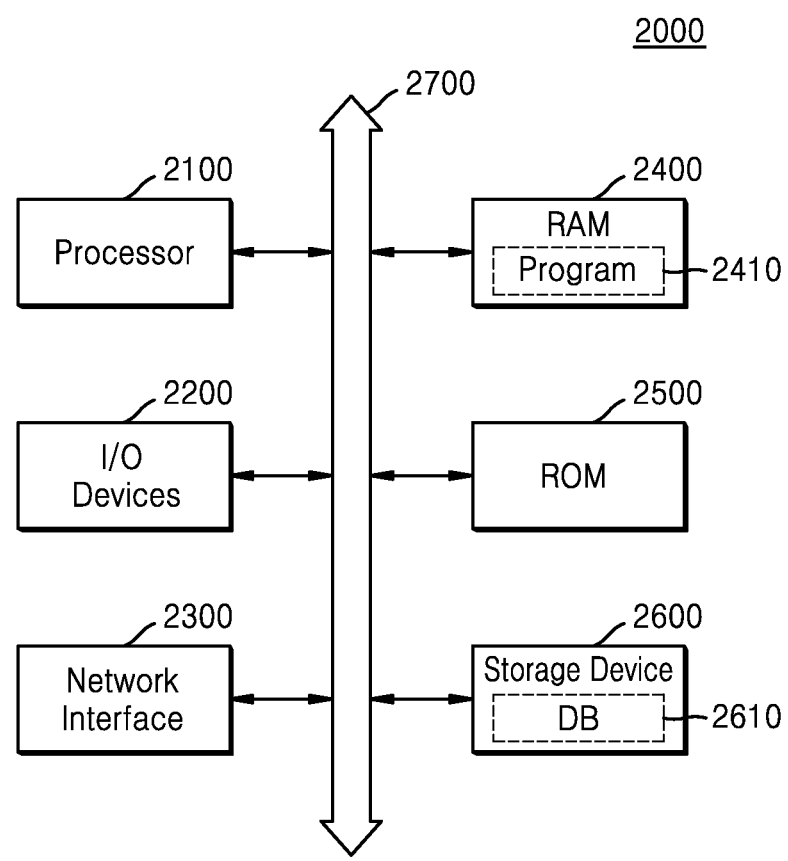
FIG. 15 is a block diagram showing a computing system including a memory storing a program, according to an example embodiment.

FIG. 15 is a block diagram showing a computing system including a memory storing a program according to an example embodiment. At least some of operations included in a method of designing an integrated circuit (e.g., S110 of FIG. 13) and a method of manufacturing an integrated circuit (e.g., S120 of FIG. 13) according to example embodiments may be performed in a computing system 2000.

Referring to FIG. 15, the computing system 2000 may be a stationary computing system such as a desktop computer, a workstation or a server, or a portable computing system such as a laptop computer.

The computing system 2000 may include a processor 2100, input/output devices 2200, a network interface 2300, a random access memory (RAM) 2400, a read only memory (ROM) 2500, and a storage device 2600. The processor 2100, the input/output devices 2200, the network interface 2300, the RAM 2400, the ROM 2500, and the storage device 2600 may be connected to a bus 2700 and may communicate with one another through the bus 2700.

The processor 2100 may be referred to as a processing unit and, for example, may include at least one core, e.g., a micro-processor, an application processor (AP), a digital signal processor (DSP), a graphics processing unit (GPU), etc., capable of executing an arbitrary instruction set (e.g., Intel Architecture-32 (IA-32), 64-bit extended IA-32, x86-64, PowerPC, Sparc, MIPS, ARM, IA-64, etc.). For example, the processor 2100 may access a memory, that is, the RAM 2400 or the ROM 2500, through the bus 2700 and may execute instructions stored in the RAM 2400 or the ROM 2500.

The RAM 2400 may store a program 2410 for a method of manufacturing an integrated circuit and a method of designing an integrated circuit according to an example embodiment or at least a portion of the program 2410, and the program 2410 may instruct the processor 2100 to perform at least some of operations included in the method of manufacturing an integrated circuit and the method of designing an integrated circuit. The program 2410 may include a plurality of instructions that may be executed by the processor 2100, and the instructions included in the program 2410 may instruct the processor 2100 to perform at least some of operations included in the flowchart of FIG. 13, for example.

The storage device 2600 may not lose stored data even when power supplied to the computing system 2000 is cut off. For example, the storage device 2600 may include a non-volatile integrated circuit or a storage medium such as a magnetic tape, an optical disk, or a magnetic disk. Also, the storage device 2600 may be detachable from the computing system 2000. The storage device 2600 may store the program 2410 according to an example embodiment, and, before the program 2410 is executed by the processor 2100, the program 2410 or at least a part thereof may be loaded to the RAM 2400. Alternatively, the storage device 2600 may store a file written in a program language, and the program 2410 generated from the file by a compiler or the like, or at least a part of the program 2410 may be loaded to the RAM 2400. Also, the storage device 2600 may store a database 2610, and the database 2610 may include information needed for designing an integrated circuit, e.g., a cell library.

The storage device 2600 may store data to be processed by the processor 2100 or data processed by the processor 2100. The processor 2100 may generate data by processing data stored in the storage device 2600 according to the program 2410 and may store generated data in the storage device 2600. For example, the storage device 2600 may store RTLs, net lists, and/or layouts.

The input/output devices 2200 may include an input device such as a keyboard and a pointing device, and may include an output device such as a display device and a printer. For example, through the input/output devices 2200, a user may trigger execution of the program 2410 by the processor 2100, may input an RTL and/or a net list, and may check a layout.

The network interface 2300 may provide access to a network outside the computing system 2000. For example, a network may include a plurality of computing systems and communication links, and the communication links may include wired links, optical links, wireless links, or any other types of links.

While aspects of example embodiments have been particularly shown and described, it will be understood that various changes in form and details may be made therein without departing from the spirit and scope of the following claims.

What is claimed is:

1. A dual-port static random access memory (SRAM) cell comprising:
    a plurality of P-type active patterns that are spaced apart from one another along a first direction, each of the plurality of P-type active patterns extending in a second direction perpendicular to the first direction and including at least one transistor, wherein the plurality of P-type active patterns comprises a first P-type active pattern, a second P-type active pattern, a third P-type active pattern, a fourth P-type active pattern, a fifth P-type active pattern and a sixth P-type active pattern which are sequentially arranged along the first direction,
    wherein a first cutting area is provided between the second P-type active pattern and a first boundary of the dual-port SRAM cell that extends along the first direction,
    a second cutting area is provided between the fifth P-type active pattern and a second boundary that is opposite to the first boundary and extends along the first direction,
    the second P-type active pattern has a constant width in the first direction, and the third P-type active pattern has a constant width in the first direction, and
    the constant width of the second P-type active pattern is different from the constant width of the third P-type active pattern.

2. The dual-port SRAM cell of claim 1, wherein the first cutting area is provided between the first P-type active pattern and the first boundary, and
    the second cutting area is provided between the sixth P-type active pattern and the second boundary.

3. A dual-port port static random access memory (SRAM) cell comprising:
    a plurality of P-type active patterns that are spaced apart from one another along a first direction, each of the plurality of P-type active patterns extending in a second direction perpendicular to the first direction and including at least one transistor, wherein the plurality of P-type active patterns comprises a first P-type active pattern, a second P-type active pattern, a third P-type active pattern, a fourth P-type active pattern, a fifth P-type active pattern and a sixth P-type active pattern which are sequentially arranged along the first direction;
    wherein a first cutting area is provided between the second P-type active pattern and a first boundary of the dual-port SRAM cell that extends along the first direction;
    a second cutting area is provided between the fifth P-type active pattern and a second boundary that is opposite to the first boundary and extends along the first direction;
    a first gate electrode provided on the second P-type active pattern and extending in the first direction;
    a second gate electrode provided on the fifth P-type active pattern, extending in the first direction, and spaced apart from the first gate electrode along the second direction;
    a third gate electrode provided on the third P-type active pattern, spaced apart from the second gate electrode along the first direction, and aligned with the second gate electrode along the first direction; and
    a fourth gate electrode provided on the fourth P-type active pattern, spaced apart from the first gate electrode along the first direction, and aligned with the first gate electrode along the first direction.

4. The dual-port SRAM cell of claim 3, wherein the first gate electrode extends in the first direction from the second P-type active pattern to the third P-type active pattern, and
    the second gate electrode extends in the first direction from the fourth P-type active pattern to the fifth P-type active pattern.

5. The dual-port SRAM cell of claim 3, wherein the first P-type active pattern and the third P-type active pattern have the same height in the second direction, and
    the dual-port SRAM cell further comprises a fifth gate electrode provided on the first P-type active pattern, aligned with the third gate electrode along the first direction, and spaced apart from the third gate electrode along the first direction.

6. The dual-port SRAM cell of claim 5, wherein the first gate electrode extends in the first direction from the first P-type active pattern to the third P-type active pattern, and
the second gate electrode extends in the first direction from the fourth P-type active pattern to the sixth P-type active pattern.

7. The dual-port SRAM cell of claim 3, further comprising:
active contacts extending in the first direction from the first P-type active pattern to the third P-type active pattern; and
a node formation pattern which extends in the second direction and is configured to connect the active contacts and the second gate electrode.

8. The dual-port SRAM cell of claim 7, wherein the active contacts and the node formation pattern comprise a same material and have top surfaces provided at a same level.

9. The dual-port SRAM cell of claim 1, wherein the constant width of the second P-type active pattern in the first direction is greater than the constant width of the third P-type active pattern in the first direction.

10. The dual-port SRAM cell of claim 1, wherein the third P-type active pattern extends from the first boundary to the second boundary.

11. The dual-port SRAM cell of claim 1, wherein the at least one transistor provided on each of the plurality of P-type active patterns is either a gate-all-around field-effect transistor (GAAFET) or a FinFET.

12. A bit cell comprising:
a plurality of active patterns spaced apart from one another along a first direction, each of the plurality of active patterns extending in a second direction perpendicular to the first direction and having a constant width in the first direction between a first boundary of the bit cell and a second boundary of the bit cell opposite to the first boundary, wherein the first boundary and the second boundary extend in the first direction, and the plurality of active patterns comprises a first active pattern, a second active pattern, a third active pattern, a fourth active pattern, a fifth active pattern, a sixth active pattern, a seventh active pattern and an eighth active pattern that are sequentially arranged along the first direction;
a first gate electrode provided on the second active pattern, the third active pattern and the fourth active pattern, and extending in the first direction; and
a second gate electrode provided on the fifth active pattern, the sixth active pattern and the seventh active pattern, extending in the first direction, and spaced apart from the first gate electrode along the second direction,
wherein a first cutting area is provided between the second active pattern and the first boundary,
a second cutting area is provided between the seventh active pattern and the second boundary,
the third active pattern and the sixth active pattern extend from the first boundary to the second boundary, and
the constant width of the second active pattern in the first direction is different from the constant width of the third active pattern in the first direction.

13. The bit cell of claim 12, wherein the first cutting area is provided between the first active pattern and the first boundary, and
the second cutting area is provided between the eighth active pattern and the second boundary.

14. The bit cell of claim 12, further comprising:
a third gate electrode provided on the third active pattern, spaced apart from the second gate electrode along the first direction, and aligned with the second gate electrode along the first direction; and
a fourth gate electrode provided on the sixth active pattern, spaced apart from the first gate electrode along the first direction, and aligned with the first gate electrode along the first direction.

15. The bit cell of claim 12, wherein the first active pattern and the eighth active pattern extend from the first boundary to the second boundary,
the first gate electrode extends in the first direction on the first active pattern, and
the second gate electrode extends in the first direction on the eighth active pattern.

16. A bit cell comprising:
a plurality of active patterns spaced apart from one another along a first direction, each of the plurality of active patterns extending in a second direction perpendicular to the first direction and having a constant width in the first direction between a first boundary of the bit cell and a second boundary of the bit cell opposite to the first boundary, wherein the first boundary and the second boundary extend in the first direction, and the plurality of active patterns comprises a first active pattern, a second active pattern, a third active pattern, a fourth active pattern, a fifth active pattern, a sixth active pattern, a seventh active pattern and an eighth active pattern that are sequentially arranged along the first direction;
a first gate electrode provided on the second active pattern, the third active pattern and the fourth active pattern, and extending in the first direction; and
a second gate electrode provided on the fifth active pattern, the sixth active pattern and the seventh active pattern, extending in the first direction, and spaced apart from the first gate electrode along the second direction, and a fifth gate electrode provided on the first active pattern, spaced apart from the first gate electrode along the second direction, spaced apart from the second gate electrode in the first direction, and aligned with the second gate electrode along the first direction,
wherein a first cutting area is provided between the second active pattern and the first boundary,
a second cutting area is provided between the seventh active pattern and the second boundary,
the third active pattern and the sixth active pattern extend from the first boundary to the second boundary,
the first active pattern and the eighth active pattern extend from the first boundary to the second boundary,
the first gate electrode extends in the first direction on the first active pattern, and
the second gate electrode extends in the first direction on the eighth active pattern.

17. The bit cell of claim 12, further comprising:
a first active contact provided on the first active pattern, the second active pattern, the third active pattern and the fourth active pattern, and extending in the first direction;
a second active contact provided on the fifth active pattern, the sixth active pattern, the seventh active pattern and the eighth active pattern, extending in the first direction, and spaced apart from the first active contact along the first direction;

a first node connected to the first active contact and the second gate electrode, and extending in the second direction; and a second node connected to the second active contact and the second gate electrode, and extending in the second direction.

18. The bit cell of claim 12, wherein the second active pattern is wider along the first direction than the third active pattern, and the seventh active pattern is wider along the first direction than the sixth active pattern.

19. A dual-port static random access memory (SRAM) cell comprising:

a plurality of active patterns spaced apart from one another along a first direction, each of the plurality of active patterns extending in a second direction perpendicular to the first direction and having a constant width in the first direction between a first boundary of the dual-port SRAM cell and a second boundary of the dual-port SRAM cell opposite to the first boundary, wherein the first boundary and the second boundary extend in the first direction, and the plurality of active patterns comprises a first active pattern, a second active pattern, a third active pattern and a fourth active pattern that are sequentially arranged along the first direction;

a first gate electrode provided on the second active pattern, the third active pattern and the fourth active pattern, extending in the first direction, and spaced apart from the first active pattern along the second direction; and a second gate electrode provided on the third active pattern, extending in the first direction, and spaced apart from the first gate electrode along the second direction, wherein a cutting area is provided between the second active pattern and the first boundary, and the constant width of the second active pattern and the constant width of the third active pattern are different.

* * * * *